(12) United States Patent
Murata et al.

(10) Patent No.: US 12,107,198 B2
(45) Date of Patent: Oct. 1, 2024

(54) BARRIER FILM AND METHOD FOR MANUFACTURING THE SAME, WAVELENGTH CONVERSION SHEET AND METHOD FOR MANUFACTURING THE SAME, AND OPTICAL LAMINATE AND METHOD FOR MANUFACTURING THE SAME

(71) Applicant: TOPPAN PRINTING CO., LTD., Tokyo (JP)

(72) Inventors: Koji Murata, Tokyo (JP); Satoshi Iwata, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 101 days.

(21) Appl. No.: 16/145,490

(22) Filed: Sep. 28, 2018

(65) Prior Publication Data
US 2019/0030859 A1    Jan. 31, 2019

Related U.S. Application Data

(63) Continuation of application No. PCT/JP2017/011213, filed on Mar. 21, 2017.

(30) Foreign Application Priority Data

Mar. 31, 2016 (JP) ................................. 2016-071048
Mar. 31, 2016 (JP) ................................. 2016-071052

(51) Int. Cl.
*H01L 33/50* (2010.01)
*B32B 7/10* (2006.01)
(Continued)

(52) U.S. Cl.
CPC .............. *H01L 33/505* (2013.01); *B32B 7/10* (2013.01); *B32B 7/12* (2013.01); *B32B 27/08* (2013.01);
(Continued)

(58) Field of Classification Search
None
See application file for complete search history.

(56) References Cited

U.S. PATENT DOCUMENTS 5,326,844 A * 7/1994 Fujiki ........................ C09J 5/02
556/439
5,482,547 A * 1/1996 Bugnon ............... C09B 67/0008
106/493

(Continued)

FOREIGN PATENT DOCUMENTS

EP    1070156 B1 * 8/2009 ........... C09D 183/06
JP    62222842 A * 9/1987
(Continued)

OTHER PUBLICATIONS

English machine translation of JP2005096108 (2005).*
(Continued)

*Primary Examiner* — Kenneth J Stachel
(74) *Attorney, Agent, or Firm* — Foley & Lardner LLP

(57) ABSTRACT

A barrier film comprising a gas barrier film, and a primer layer disposed on one of outermost surfaces thereof and made of a cured product of a primer composition comprising at least one organometallic compound selected from the group consisting of a metal chelating compound, a metal alkoxide compound and a metal acylate compound.

19 Claims, 13 Drawing Sheets

(51) Int. Cl.
    *B32B 7/12*         (2006.01)
    *B32B 27/08*       (2006.01)
    *B32B 27/36*       (2006.01)
    *B32B 27/38*       (2006.01)
    *B32B 37/12*       (2006.01)
    *B32B 37/18*       (2006.01)
    *C09K 11/02*       (2006.01)
    *C09K 11/88*       (2006.01)
    *G02B 5/20*        (2006.01)
    *B82Y 20/00*       (2011.01)
    *B82Y 30/00*       (2011.01)
    *B82Y 40/00*       (2011.01)

(52) U.S. Cl.
CPC .............. *B32B 27/36* (2013.01); *B32B 27/38* (2013.01); *B32B 37/12* (2013.01); *B32B 37/182* (2013.01); *C09K 11/02* (2013.01); *C09K 11/883* (2013.01); *G02B 5/20* (2013.01); *B32B 2255/10* (2013.01); *B32B 2255/20* (2013.01); *B32B 2255/24* (2013.01); *B32B 2255/26* (2013.01); *B32B 2255/28* (2013.01); *B32B 2307/42* (2013.01); *B32B 2307/422* (2013.01); *B32B 2307/7244* (2013.01); *B32B 2307/7246* (2013.01); *B32B 2367/00* (2013.01); *B82Y 20/00* (2013.01); *B82Y 30/00* (2013.01); *B82Y 40/00* (2013.01)

(56) References Cited

U.S. PATENT DOCUMENTS

| | | | | |
|---|---|---|---|---|
| 2003/0116273 | A1* | 6/2003 | Nakamura | C09J 5/02 156/330 |
| 2004/0115445 | A1* | 6/2004 | Sasaki | B05D 7/57 428/483 |
| 2012/0113672 | A1* | 5/2012 | Dubrow | B32B 5/16 977/774 |
| 2015/0300600 | A1 | 10/2015 | Dubrow et al. | |
| 2015/0307717 | A1* | 10/2015 | Kojima | C09D 183/04 257/98 |
| 2016/0075910 | A1* | 3/2016 | Omori | C08J 7/046 428/480 |
| 2016/0327690 | A1 | 11/2016 | Tokinoya et al. | |
| 2016/0349428 | A1 | 12/2016 | Dubrow et al. | |
| 2016/0363713 | A1 | 12/2016 | Dubrow et al. | |
| 2017/0321115 | A1 | 11/2017 | Satake et al. | |
| 2019/0391319 | A1 | 12/2019 | Dubrow et al. | |

FOREIGN PATENT DOCUMENTS

| | | | | |
|---|---|---|---|---|
| JP | 11058592 | A | * | 3/1999 |
| JP | 2012183823 | A | * | 9/2012 |
| JP | 2013-544018 | A | | 12/2013 |
| JP | 2015057640 | A | | 3/2015 |
| JP | 2016-117209 | A | | 6/2016 |
| JP | 2016-143562 | A | | 8/2016 |
| KR | 10-2015-0133137 | A | | 11/2015 |
| WO | WO 2014/113562 | | | 7/2014 |
| WO | WO-2014192500 | A1 | * | 12/2014 ............ C08J 7/0427 |
| WO | WO 2016/010116 | A1 | | 1/2016 |
| WO | WO-2016/098504 | A1 | | 6/2016 |

OTHER PUBLICATIONS

English Machine Translation of KR20150133137 (2015).*
CAS Registry No. 17501-79-0 SciFinder (2021).*
JP62222842A English machine translation (1987).*
English machine translation of JPH1158592 (1999).*
English machine translation of JP2012-183823 (2012).*
English machine translation of EP1070156B1 (2009).*
Office Action dated May 19, 2020 for corresponding Japanese Patent Application No. 2016-071048.
Office Action dated May 19, 2020 for corresponding Japanese Patent Application No. 2016-071052.
International Search Report regarding Int'l. Appl. No. PCT/JP2017/011213, mail date Jun. 13, 2016, 2 pps.
Office Action dated Aug. 31, 2021 issued in a corresponding Korean Patent Application No. 10-2018-7028665, (11 pages).

* cited by examiner

BARRIER FILM AND METHOD FOR MANUFACTURING THE SAME, WAVELENGTH CONVERSION SHEET AND METHOD FOR MANUFACTURING THE SAME, AND OPTICAL LAMINATE AND METHOD FOR MANUFACTURING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2017/011213, filed on Mar. 21, 2017, which is based upon and claims the benefit of priority to Japanese Patent Application Nos. 2016-071048, filed on Mar. 31, 2016, and 2016-071052, filed on Mar. 31, 2016, the disclosures of which are all hereby incorporated herein by reference in their entireties.

TECHNICAL FIELD

The present invention relates to a barrier film and a manufacturing method thereof, a wavelength conversion sheet and a manufacturing method thereof, and an optical laminate and a manufacturing method thereof.

BACKGROUND

An wavelength conversion sheet making use of a phosphor such as quantum dots is so high in luminance and color reproducibility and thus has been expected to be adopted for displays. However, the phosphor such as quantum dots deteriorates upon contact with oxygen or moisture. Hence, the wavelength conversion sheet has often adopted such a structure that a barrier film including a polymer film and a gas barrier layer formed thereon is disposed on one or opposite surfaces of a phosphor layer containing a phosphor.

For example, in Patent Literature 1, it is stated that a barrier film is laminated to opposite surfaces of a phosphor layer wherein quantum dots are dispersed in an acrylic resin and an epoxy resin thereby preventing oxygen and the like from being infiltrated into the phosphor layer.

CITATION LIST

[Patent Literature] PTL 1: WO 2014/113562

SUMMARY OF THE INVENTION

Technical Problem

However, the phosphor layer wherein quantum dots made of an inorganic material as described in Patent Literature 1 are dispersed is poor in adhesion to the barrier film, with concern that peeling occurs between the phosphor layer and the barrier film. Where the sheet is exposed to a high humidity environment over a long time, there is some concern that peeling also occurs between the phosphor layer and the barrier film. The peeling of the barrier film gives a great influence on the lowering of performance not only in a wavelength conversion sheet, but also in an optical laminate. Accordingly, it has been required to improve adhesion between the barrier film and an adherend.

The present invention has been made in consideration of the problems involved in the prior art and has for its first object the provision of a barrier film improved or even excellent in adhesion with an adherend such as a phosphor layer and a manufacturing method thereof, and a wavelength conversion sheet and a manufacturing method thereof.

The invention has been made while taking the prior art problems into consideration and has for its second object the provision of an optical laminate which has good gas barrier properties and is improved or even excellent in adhesion between a barrier film and an adherend and a method for manufacturing the same. The present invention also has for its second object the provision of a wavelength conversion sheet having good gas barrier properties and improved or even excellent adhesion between a barrier film and a phosphor layer and a method for manufacturing the same.

Intended Solution to Problem (First Aspect)

In order to achieve the above first object, a first aspect of the invention provides a barrier film, which comprises a gas barrier film, and a primer layer disposed on one outermost surface thereof and made of a cured product of a primer composition comprising at least one organometallic compound selected from the group consisting of a metal chelating compound, a metal alkoxide compound and a metal acylate compound, and a silane coupling agent.

According to the above barrier film, the primer layer made of a cured product of the primer composition containing a specific type of organometallic compound and a silane coupling agent is disposed on one of the outermost layers thereof so that an adherend such as a phosphor layer is laminated through the primer layer thereby ensuing improved or even excellent adhesion to the adherend. This is because the silane coupling agent exhibits high affinity for the adherend thereby improving the adhesion. Moreover, the silane coupling agent is hydrolyzed to generate a silanol group in the primer layer. This silanol group reacts with a polar functional group, such as a hydroxyl group, on the layer surface in contact with the primer layer thereby contributing to improved adhesion. Thus, it becomes possible to inhibit the infiltration of moisture and oxygen from the interface between the primer layer and its contact layer. When the organometallic compound and the silane coupling agent are used in combination, a primer layer having a satisfactory thickness enough to ensure improve or even excellent adhesion can be more easily obtained than in the case that such a silane coupling agent is used singly. On this occasion, the steps of excess application of heat or UV irradiation and aging are not necessarily required. The organometallic compound are incorporated into the mutual bonding of the silane coupling agent, resulting in the formation of a stronger primer layer and leading to contribution to improved adhesion associated therewith. Moreover, the organometallic compound serves as a binder for mutual bonding of an unreacted silane coupling agent, so that stickiness can be prevented as would be generated by the excess presence of an unreacted coupling agent in the primer layer thus ensuring easy handling. Therefore, the barrier film enables improved or even excellent adhesion to an adherend such as a phosphor layer.

According to the barrier film having been configured as stated above, a good blocking resistance can be obtained. Even when the wavelength conversion sheet making use of the barrier film is employed in backlight unit after long-term storage at high temperatures, a good luminance can be obtained.

In the barrier film, the organometallic compound should preferably contain at least one meal selected from the group consisting of aluminum, zirconium, titanium and tin. When using such an organometallic compound, the resultant barrier film ensures more excellent adhesion to an adherend such as a phosphor layer and good handling properties with suppressed stickiness.

In the barrier film, the silane coupling agent should preferably have at least one functional group selected from the group consisting of a vinyl group, an epoxy group, a styryl group, a methacrylic group, an acrylic group, an amino group, an isocyanurate group, a ureido group, a mercapto group, a sulfido group and an isocyanate group. When using such a silane coupling agent, it is ensured that the barrier film has more improved or even excellent adhesion to an adherend such as a phosphor layer. The proper choice of the functional group of the silane coupling agent can lead to improved or even excellent adhesion to a variety of adherends. Especially, in the case where a functional group is present on the surface of an adherend, the use of a selected type of silane coupling agent having a functional group having reactivity with or affinity for the first-mentioned functional group results in more improved or even excellent adhesion.

In the barrier film, the thickness of the primer layer is preferably from 1 to 1000 nm. If the thickness of the primer layer is within the above-defined range, better adhesion between the barrier film and an adherend can be obtained and the infiltration of moisture and oxygen gas from the end portion of the primer layer can be adequately suppressed.

The present invention also provides a wavelength conversion sheet, which comprises a phosphor layer containing a phosphor, and a barrier film of the present invention stacked on at least one surface of the phosphor layer wherein the barrier film has such a primer layer as set out above on the outermost surface of the phosphor layer side thereof.

According to the wavelength conversion sheet, the barrier film and the phosphor layer are laminated through a primer layer made of a cured product of a primer composition comprising a specific type of organometallic compound and a silane coupling agent, so that improved or even excellent adhesion between the barrier film and the phosphor layer can be obtained.

The present invention also provides a method for manufacturing a barrier film including a gas barrier film and a primer layer disposed on one of outmost surfaces thereof, the method comprising the steps of coating and curing, onto the gas barrier film, a primer composition containing at least one organometallic compound selected from the group consisting of a metal chelating compound, a metal alkoxide compound and a metal acylate compound, and a silane coupling agent to form the primer layer.

According to the manufacturing method, there can be easily manufactured a barrier film having improved or even excellent adhesion with an adherend such as a phosphor layer and improved or even excellent handling properties. The primer layer becomes sticky due to the shortage of curing when using a silane coupling agent alone, so that the handling properties are liable to lower. When an organometallic compound is further contained, curing is promoted to reduce the stickiness, thereby enabling improved handling properties.

The present invention also provide a method for manufacturing a wavelength conversion sheet including a phosphor layer containing a phosphor and a barrier film stacked on at least one surface of the phosphor layer and having a gas barrier film and a primer layer disposed on the outermost surface of a phosphor layer side thereof, the method comprising the steps of coating and curing, on the gas barrier film, a primer composition comprising at least one organometallic compound selected from the group consisting of a metal chelating compound, a metal alkoxide compound and a metal acylate compound and a silane compound agent to form the primer layer, and laminating the phosphor layer and the barrier film.

According to the above manufacturing method, there can be readily obtained a wavelength conversion sheet having improved or even excellent adhesion between the barrier film and the phosphor layer.

(Second Aspect)

In order to achieve the second object, the second aspect of the present invention provides an optical laminate comprising an adherend containing an epoxy resin, and a barrier film stacked on at least one surface of the adherend wherein the barrier film has a primer layer disposed on the outermost surface of the adherend side thereof and made of a cured product of a primer composition comprising an amino group-containing silane coupling agent.

According to the optical laminate, the lamination of the barrier film and the adherend through the primer layer made of a cured product of a primer composition containing an amino group-containing silane coupling agent can lead to improved or even excellent adhesion between the barrier film and the adherend. Presumably, this is because the epoxy resin present in the adherend and the amino group present in the primer layer react with each other to enhance adhesion therebetween. The amino group-containing silane coupling agent generates a silanol group by hydrolysis in the primer layer. This silanol group reacts with a polar functional group, such as a hydroxyl group, on the layer surface in contact with the primer layer thereby contributing to improved adhesion. Moreover, it is possible to inhibit the infiltration of moisture and oxygen from the interface between the primer layer and its contact layer. Hence, the optical laminate not only has good gas barrier properties, but also is improved or even excellent in adhesion between the barrier film and the adherend. Even when the laminate is exposed to a high humidity environment over a long time, peeling between the phosphor layer and the barrier film is suppressed from occurring.

In the optical laminate, the thickness of the primer layer is preferably from 1 to 1000 μm. If the thickness of the primer layer is within the above-defined range, better adhesion between the barrier film and the adherend can be obtained, and the infiltration of moisture and oxygen from the end portion of the primer layer can be adequately suppressed.

In the optical laminate, the barrier film should preferably have a laminate structure wherein the primer layer, a first substrate, a barrier layer and a second substrate are at least disposed in this order. When the substrates are disposed at opposite sides of the barrier layer, the barrier layer can be prevented from being damaged and thus, more improved or even excellent gas barrier properties can be obtained.

The present invention further provides a wavelength conversion sheet, which comprises a phosphor layer containing an epoxy resin and a phosphor, and a barrier film stacked on at least one surface of the phosphor layer wherein the barrier film has a primer layer on the outermost surface of the phosphor layer side thereof and made of a cured product of a primer composition comprising an amino group-containing silane coupling agent.

According to the wavelength conversion sheet, since the barrier film and the phosphor layer are laminated through the primer layer made of a cured product of the primer composition containing an amino group-containing silane coupling agent, improved or even excellent adhesion between the barrier film and the phosphor layer can be obtained. Presumably, this is because the adhesion is enhanced by reaction between the epoxy resin present in the phosphor layer and the amino group present in the primer layer. The amino group-containing silane coupling agent generates a silanol group by hydrolysis in the primer layer. This silanol group reacts with a polar functional group, such as a hydroxyl group, on the layer surface in contact with the primer layer thereby contributing to improved adhesion and making it possible to inhibit the infiltration of moisture and oxygen from the interface between the primer layer and its contact layer. Hence, the wavelength conversion sheet not only has good gas barrier properties, but also is improved or even excellent in adhesion between the barrier film and the phosphor layer. Even when the sheet is exposed to a high humidity environment over a long time, peeling between the phosphor layer and the barrier film is suppressed from occurring.

The present invention also provides a method for manufacturing an optical laminate including an adherend containing an epoxy resin, and a barrier film laminated on at least one surface of the adherend and having a primer layer on an outermost surface of the adherend side thereof, the method comprising the steps of coating and curing, on an underlying layer for the primer layer in the barrier film, a primer composition containing an amino group-containing silane coupling agent to form the primer layer, and laminating the adherend and the barrier film.

According to this manufacturing method, there can be readily manufactured an optical laminate which has good gas barrier properties and is improved or even excellent in adhesion between the barrier film and the adherend.

The present invention further provides a method for manufacturing a wavelength conversion sheet including a phosphor layer containing an epoxy resin and a phosphor, and a barrier film stacked on at least one surface of the phosphor layer and having a primer layer on an outermost surface of a phosphor layer side thereof, the method comprising the steps of coating and curing, on an underlying layer for the primer layer in the barrier film to form the primer layer, and laminating the phosphor layer and the barrier film.

According to the manufacturing method, there can be readily obtained a wavelength conversion sheet, which has good barrier properties and is improved or even excellent in adhesion between the barrier film and the phosphor layer.

Desired Effect of Invention

According to the first aspect of the invention, there can be provided a barrier film having improved or even excellent adhesion with an adherend such as a phosphor layer and its manufacturing method, and a wavelength conversion sheet and its manufacturing method.

According to the second aspect of the invention, there can also be provided an optical laminate, which has good barrier properties and is improved or even excellent in adhesion between a barrier film and an adherend and its manufacturing method. According to the present invention, there can be further provided a wavelength conversion sheet, which has good barrier properties and is improved or even excellent in adhesion between a barrier film and a phosphor layer, along its manufacturing method.

DESCRIPTION OF REPRESENTATIVE EMBODIMENTS

Figure 1:
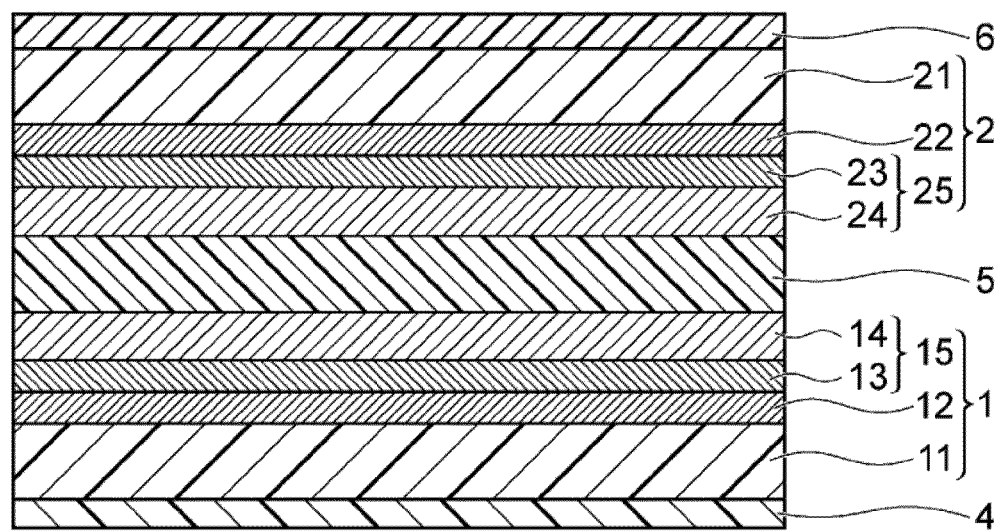
FIG. 1 is a schematic sectional view showing an embodiment of a barrier film of the invention.

Preferred embodiments of the present invention are now described in detail with reference to the accompanying drawings. With reference to the drawings, barrier films according to embodiments of the present invention will be described. It is to be understood that the present invention is not limited to the following embodiments, which are intended to be representative of the present invention. The representative embodiments described below are merely examples of the present invention, and the design thereof could be appropriately changed by one skilled in the art. Incidentally, unless there is a reason for the sake of convenience, the same reference signs will be used for identical components, and redundant explanations will be omitted. It will be noted that in the drawings, like or corresponding parts are designated by like reference numerals and redundant illustrations therefor are omitted. The dimensional ratios in the drawings should not be construed as limited to those ratios shown therein.

[Barrier Film and Wavelength Conversion Sheet]

The barrier film related to the first aspect of the invention includes a gas barrier film, and a primer layer disposed on one outermost surface of the barrier film and made of a cured product of a primer composition containing at least one organometallic compound selected from the group consisting of a metal chelating compound, a metal alkoxide compound and a metal acylate compound, and a silane coupling agent. Preferred embodiments of the barrier film according to the invention are illustrated with reference to the drawings.

FIGS. 1 to 6 are a schematic sectional view, respectively, showing an embodiment of a barrier film of the invention. A barrier film 100 shown in FIG. 1 includes a first film 1 serving as a gas barrier film, a second film 2 serving as another gas barrier film, a primer layer 4, an adhesion layer 5, and a mat layer 6. The first film 1 has a first substrate 11, an anchor coat layer 12, and a barrier layer 15 including an inorganic thin film layer 13 and a gas barrier coating layer 14. The second film 2 has a second substrate 21, an anchor coat layer 22, and a barrier layer 25 including an inorganic thin film layer 23 and a gas barrier coating layer 24. The first film 1 and the second film 2 are laminated through the adhesion layer 5 in such a way that the gas barrier coating layer 14 and the gas barrier coating layer 24 are facing each other. In the barrier film 100, the primer layer 4 is disposed on the surface of the first substrate 11 side of the first film 1 in contact with the first substrate 11, and the mat layer 6 is disposed on the surface of the second substrate 21 side of the second film 2 in contact with the second substrate 21. The barrier film 100 having the structure shown in FIG. 1 can adequately suppress the transmission of moisture and oxygen since the two gas barrier films of the first and second films 1, 2 are laminated. The barrier layers 15, 25 are located at the inner sides of the first and second substrates 11, 21, so that the barrier layers 15, 25 are protected and thus, damage on the barrier layers 15, 25 is suppressed.

Figure 2:
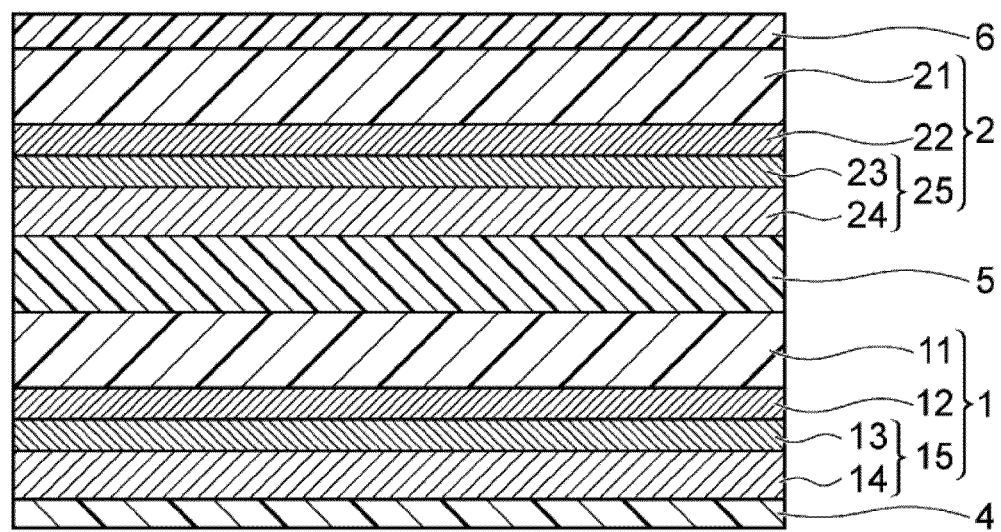
FIG. 2 is a schematic sectional view showing another embodiment of a barrier film of the invention.

A barrier film 200 shown in FIG. 2 includes a first film 1 serving as a gas barrier film, a second film 2 serving as a gas barrier film, a primer layer 4, an adhesion layer 5, and a mat layer 6. The first film 1 has a first substrate 11, an anchor coat layer 12, and a barrier layer 15 including an inorganic thin film layer 13 and a gas barrier coating layer 14. The second film 2 includes a second substrate 21, an anchor coat layer 22, and a barrier layer 25 including an inorganic thin film layer 23 and a gas barrier coating layer 24. The first film 1 and the second film 2 are laminated through the adhesion layer 5 in such a way that the first substrate 11 and the gas barrier coating layer 24 are facing each other. In the barrier film 200, the primer layer 4 is disposed on the surface of the gas barrier coating layer 14 side of the first film 1 in contact with the gas barrier coating layer 14. The mat layer 6 is disposed on the surface of the second substrate 21 side of the second film 2 in contact with the second substrate 21. The barrier film 200 having the structure shown in FIG. 2 is such that since the two gas barrier films of the first and second films 1, 2 are laminated, the transmission of moisture and oxygen can be more adequately suppressed. Moreover, the barrier layer 15 is disposed at the side of the primer layer 4, or is disposed more closely to an adherend, so that the infiltration of moisture and oxygen toward the adherend can be more adequately suppressed.

Figure 3:
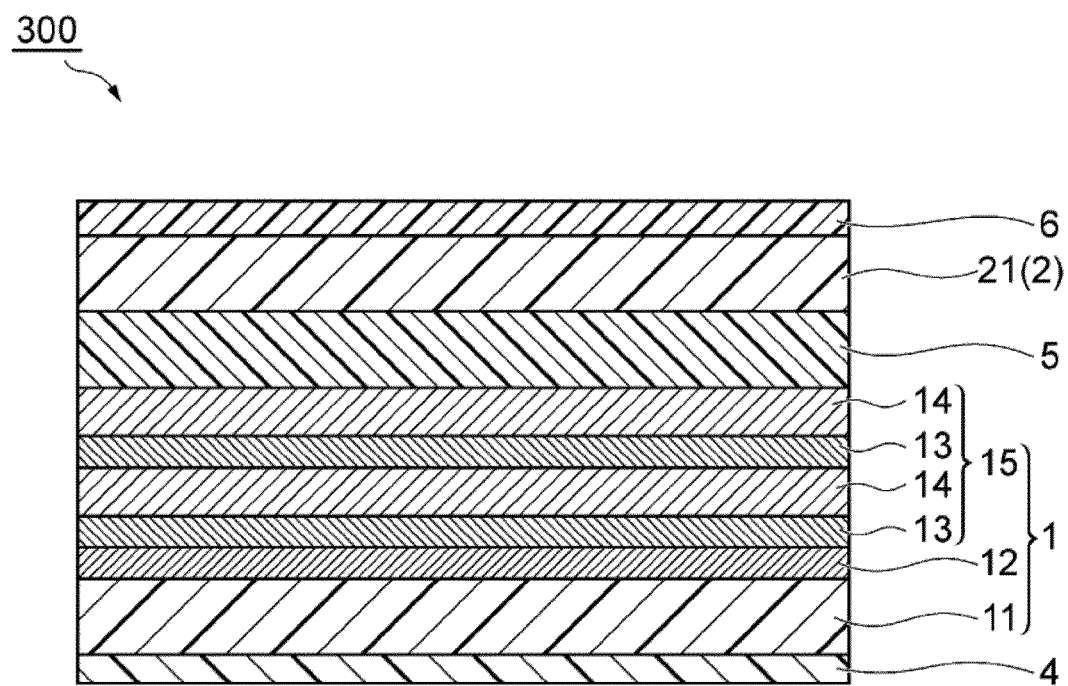
FIG. 3 is a schematic sectional view showing a further embodiment of a barrier film of the invention.

A barrier film 300 shown in FIG. 3 includes a first film 1 serving as a gas barrier film, a second film 2, a primer layer 4, an adhesion layer 5, and a mat layer 6. The first film 1 has a first substrate 11, an anchor coat layer 12, and a barrier layer 15 wherein two inorganic thin film layers 13 and two gas barrier coating layers 14 are alternately stacked. The second film 2 is constituted of a second substrate 21 alone. The first film 1 and the second film 2 are laminated through the adhesion layer 5 so that the bar barrier coating layer 14 and the second substrate 21 are facing each other. In the barrier film 300, the primer layer 4 are disposed on the surface of the first substrate 11 side of the first film 1 in contact with the first substrate 11, and the mat layer 6 is disposed on the surface of the second substrate 21 constituting the second film 2 at the side opposite to the adhesion layer 5 in contact with the second substrate 21. The barrier film 300 having the structure shown in FIG. 3 is such that the second film is formed of the second substrate 21 alone, so that it is possible to simplify the manufacturing procedure and realize cost reduction and also to impart rigidity by changing the thickness of the second substrate 21, if necessary. Additionally, the barrier layer 15 has such a structure that the two inorganic thin layers 13 and the two gas barrier coating layers 14 are alternately stacked and thus, gas barrier properties can be enhanced.

Figure 4:
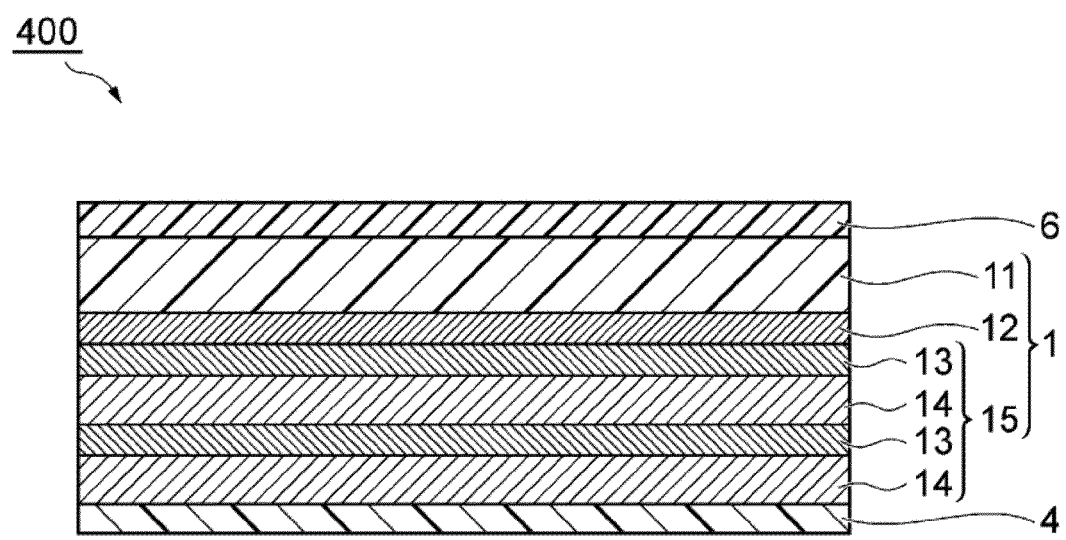
FIG. 4 is a schematic sectional view showing a still further embodiment of a barrier film of the invention.

A barrier film 400 shown in FIG. 4 includes a first film 1 serving as a gas barrier film, a primer layer 4, and a mat layer 6. The first film 1 has a first substrate 11, an anchor coat layer 12, and a barrier layer 15 wherein two inorganic thin film layers 13 and two gas barrier coating layers 14 are alternately stacked. In the barrier film 300, the primer layer 4 is disposed on the surface of the gas barrier coating layer 14 side of the first film 1 in contact with the gas barrier coating layer 14, and the mat layer 6 is disposed on the surface of the substrate 11 side of the first film 1 in contact with the first substrate 11. The barrier film 400 having the structure shown in FIG. 4 has neither a second film 2 nor an adhesion layer 5, thus leading to the simplification of a manufacturing procedure, cost reduction and thin designing. The barrier layer 15 has a structure wherein two inorganic thin film layers 13 and two gas barrier coating layers 14 are alternately stacked, thus enabling gas barrier properties to be enhanced.

Figure 5:
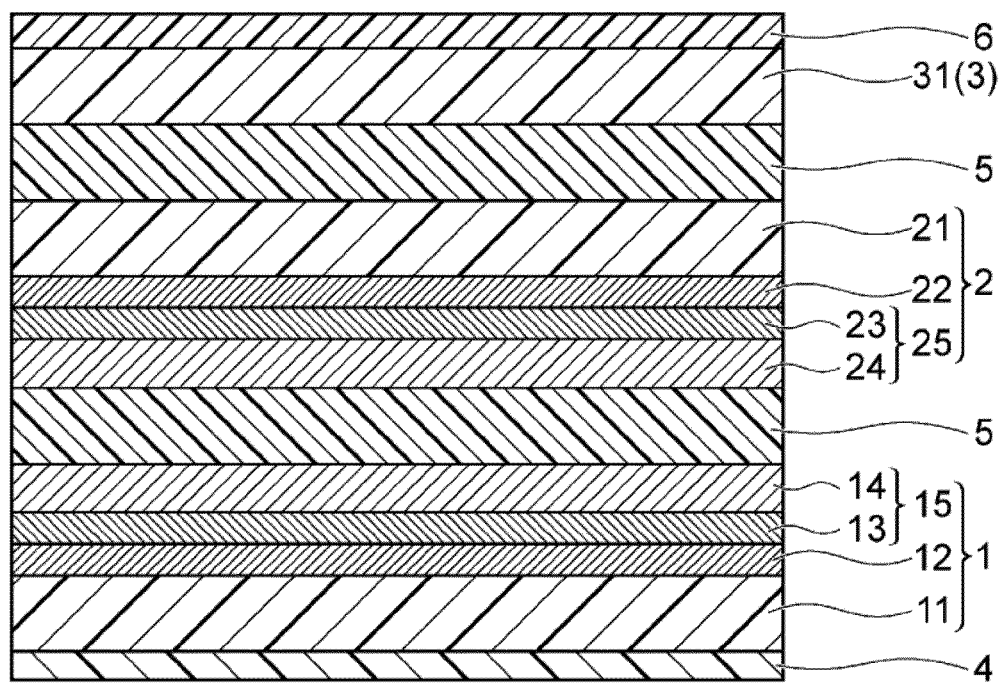
FIG. 5 is a schematic sectional view showing another embodiment of a barrier film of the invention.

A barrier film 500 shown in FIG. 5 includes a first film 1 serving as a gas barrier film, a second film 2 serving as a gas barrier film, a third film 3, a primer layer 4, an adhesion layer 5, and a mat layer 6. The first film 1 has a first substrate 11, an anchor coat layer 12, and a barrier layer 15 including an inorganic thin film layer 13 and a gas barrier coating layer 14. The second film 2 has a second substrate 21, an anchor coat layer 22, and a barrier layer 25 including an inorganic thin film layer 23 and a gas barrier coating layer 24. The third film 3 is constituted of a third substrate 31 alone. The first film 1 and the second film 2 are laminated through the adhesion layer 5 so that the gas barrier coating layer 14 and the gas barrier coating layer 24 are facing each other. The second film 2 and the third film 3 are laminated through the adhesion layer 5 so that the second substrate 21 and the third substrate 31 are facing each other. In the barrier film 500, the primer layer 4 is disposed on the surface of the first substrate 11 side of the first film 1 in contact with the first substrate 11, and the mat layer 6 is disposed on the surface at the side, opposite to the adhesion layer 5, of the third substrate 31 serving as the third film 31. The barrier film 500 having the structure shown in FIG. 5 are such that the two gas barrier films of the first and second films 1, 2 are laminated, the transmission of moisture and oxygen can be more adequately suppressed. Since the barrier layers 15, 25 are located at the inner sides of the first and second substrates 11, 21, the barrier layers 15, 25 are protected, thereby suppressing the damages of the barrier layers 15, 25. Moreover, since the third film 3 is provided, the occurrence of wrinkles in the barrier film 500 can be suppressed. When the thickness of the third substrate 31 is appropriately changed, rigidity can be imparted, if necessary.

Figure 6:
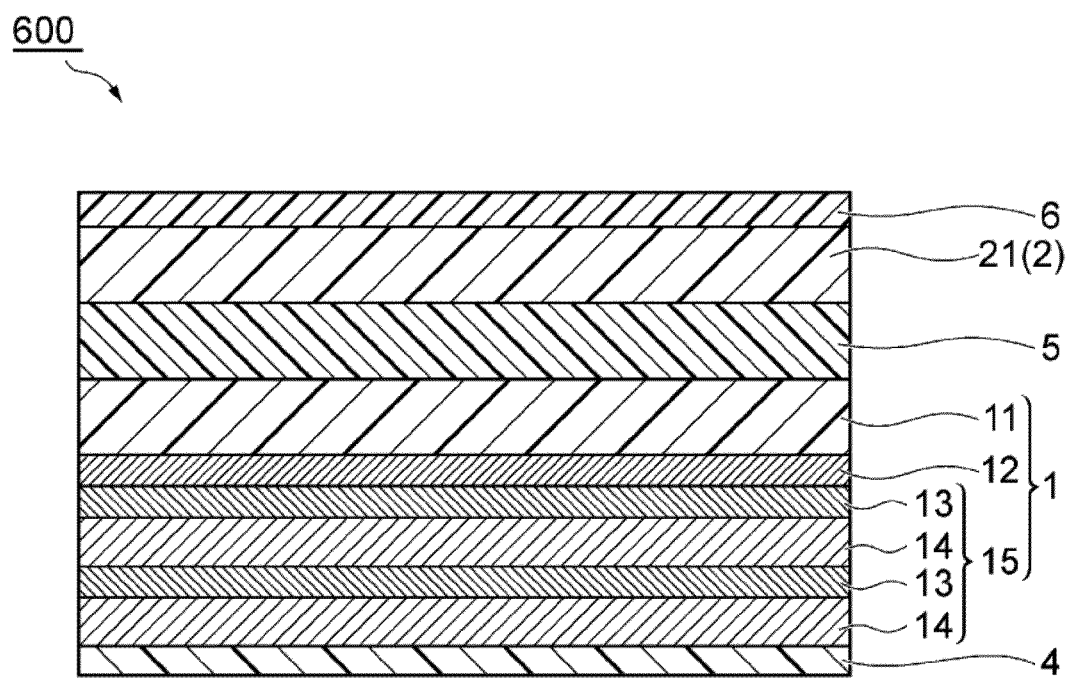
FIG. 6 is a schematic sectional view showing still another embodiment of a barrier film of the invention.

A barrier film 600 shown in FIG. 6 includes a first film 1 serving as a gas barrier film, a second film 2, a primer film 4, an adhesion layer 5, and a mat layer 6. The first film 1 has a first substrate 11, an anchor coat layer 12, and a barrier layer 15 wherein two inorganic thin film layers 13 and two gas barrier coating layers 14 are alternately stacked. The second film 2 is constituted of a second substrate 21 alone. The first film 1 and the second film 2 are laminated through the adhesion layer 5 so that the first substrate 11 and the second substrate 21 are facing each other. In the barrier film 600, the primer layer 4 is disposed on the surface of the gas barrier coating layer 14 side of the first film 1 in contact with the gas barrier coating layer 14. The mat layer 6 is disposed on the surface, opposite to the adhesion layer 5 side, of the second substrate 21 constituting the second film 21 in contact with the second film 21. The barrier film 600 having the structure shown in FIG. 6 is such that the second film 2 is constituted of the second substrate 21 alone, so that the simplification of the manufacturing procedure and cost reduction can be realized. Moreover, when the thickness of the second substrate 21 can be changed, rigidity can be imparted, if necessary. Additionally, gas barrier properties can be enhanced due to the structure of the barrier layer 15 wherein the two inorganic thin film layers 13 and the two gas barrier coating layers 14 are alternately stacked.

The barrier film having such a configuration as set out above has good gas barrier properties and can provide improved or even excellent adhesion when laminated with an adherend, such as phosphor layer, through the primer layer 4. The primer layer 4 shows very good adhesion to both of the first substrate 11 and the gas barrier coating layer 14. Thus, peeling inside the barrier film can be adequately suppressed. Therefore, the barrier film configured as described above is able to suppress the infiltration of oxygen and moisture from the interface between the barrier film and the adherend. In view of adhesion, the primer layer 4 is preferably one obtained by coating onto the first substrate 11. If the adhesion between the primer layer 4 and the first substrate 11 or the gas barrier coating layer 14 is poor, the adhesion with the primer layer 4 can be more improved by subjecting the first substrate 11 or the gas barrier coating layer 14 to corona treatment, flame treatment or plasma treatment.

Figure 7:
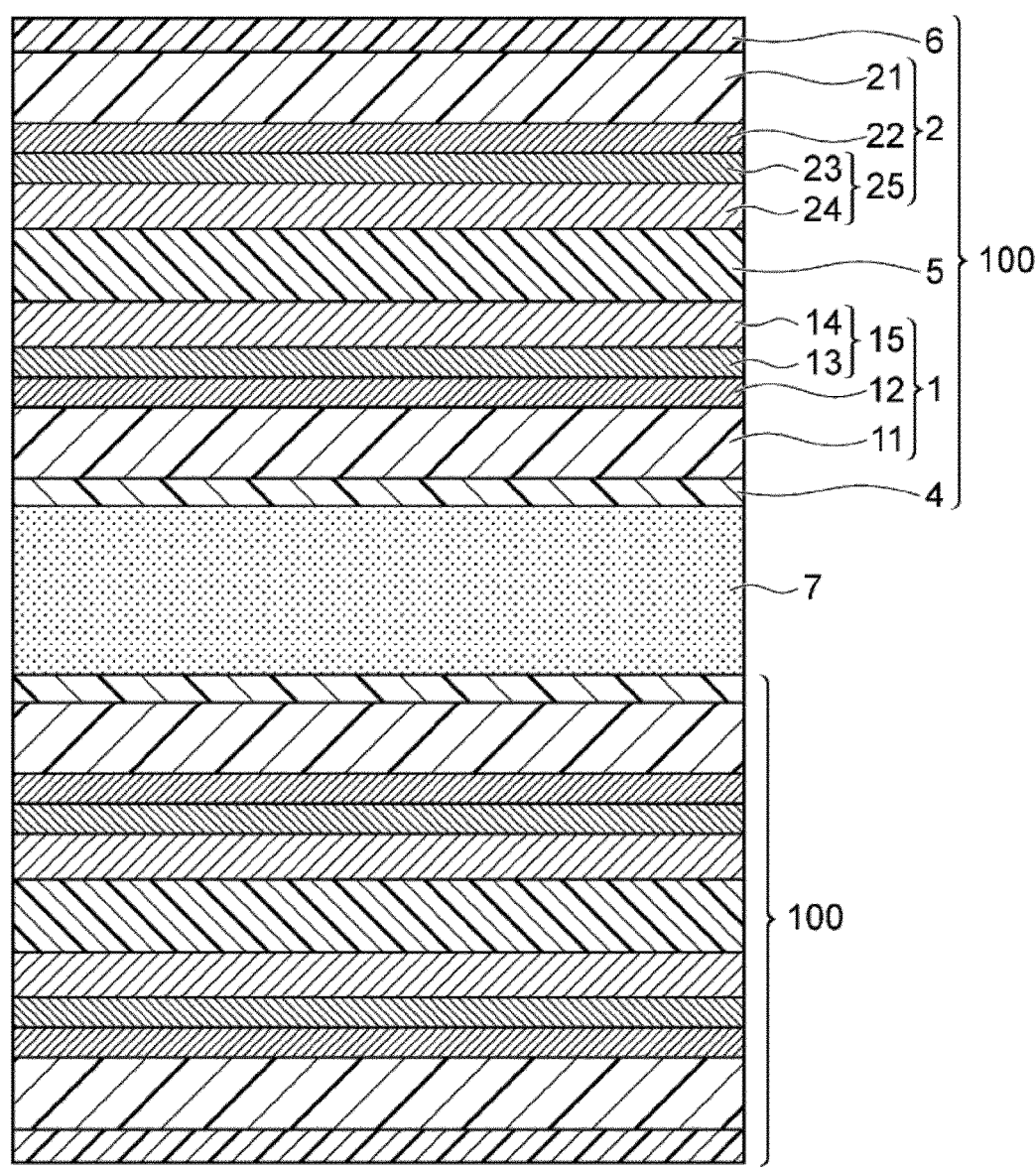
FIG. 7 is a schematic sectional view showing an embodiment of a wavelength conversion sheet of the invention.

The wavelength conversion sheet according to the first aspect of the present invention using the barrier film includes a phosphor layer containing a phosphor, the barrier film of the invention stacked on at least one surface of the phosphor layer. The barrier film should have such a primer layer as described above on the outermost surface of the phosphor layer side. FIG. 7 is a schematic sectional view showing an embodiment of a wavelength conversion sheet of the present invention. A wavelength conversion sheet 800 shown in FIG. 7 has such a structure that a phosphor layer 7 containing a phosphor and having a wavelength conversion function is sandwiched between a pair of barrier films 100. The pair of barrier films 100 and the phosphor layer 7 are stacked so that the primer layer 4 is in contact with the phosphor layer 7. With the wavelength conversion sheet 800 having such a configuration as describe above, since the barrier film 100 and the phosphor layer 7 are laminated through the primer layer 4, improved or even excellent adhesion is obtained. It will be noted that the barrier film 100 may be replaced by the barrier film 200, the barrier film 300 or the barrier film 400.

The optical laminate related to the second aspect of the present invention includes an adherend containing an epoxy resin, a barrier film stacked on at least one surface of the adherend wherein the barrier film has, on the outermost surface of the adherend side thereof, a primer layer made of a cured product of a primer composition containing an amino group-containing silane coupling agent. A specific example of the optical laminate includes a wavelength conversion sheet. The adherend differs depending on the type of optical laminate and is a phosphor layer in the case where the optical laminate is a wavelength conversion sheet.

Preferred embodiments of the invention are hereinafter illustrated based on the case that the optical laminate means a wavelength conversion sheet.

FIGS. 8 to 13 are, respectively, a schematic sectional view showing an embodiment of a wavelength conversion sheet of the invention. A wavelength conversion sheet 1100 shown in FIG. 8 has such a structure that a phosphor layer 7 containing an epoxy resin and having a wavelength conversion function is sandwiched between a pair of barrier films 50. The barrier film 50 includes a first film 1, a second film 2, a primer layer 4, an adhesion layer 5, and a mat layer 6. The first film 1 includes a first substrate 11, an anchor coat layer 12, and a barrier layer 15 made up of an inorganic thin film layer 13 and a gas barrier coating layer 14. The second film 2 includes a second substrate 21, an anchor coat layer 22, and a barrier layer 25 made up of an inorganic thin film layer 23 and a gas barrier coating layer 24. The first film 1 and the second film 2 are laminated through the adhesion layer 5 so that the gas barrier coating layer 14 and the gas barrier coating layer 24 are facing each other. In the barrier film 50, the primer layer 4 is disposed on the surface of the first substrate 11 side of the first film 1 in contact with the first substrate 11. The mat layer 6 is disposed on the surface of the second substrate 21 side of the second film 2 in contact with the second substrate 21. The pair of the barrier films 50 and the phosphor layer 7 are so stacked that the primer layer 4 is in contact with the phosphor layer 7. The wavelength conversion sheet 1100 having the structure shown in FIG. 8 has the barrier film 50 wherein the two gas barrier films, i.e. the first and second films 1, 2, are laminated, so that the transmission of moisture and oxygen can be more adequately suppressed. In the barrier film 50, since the barrier layers 15, 25 are disposed more inside than the first and second substrates 11, 21, the barrier layers 15, 25 are protected thereby suppressing the damage of the barrier layers 15, 25 prior to lamination with the phosphor layer 7.

Figure 9:
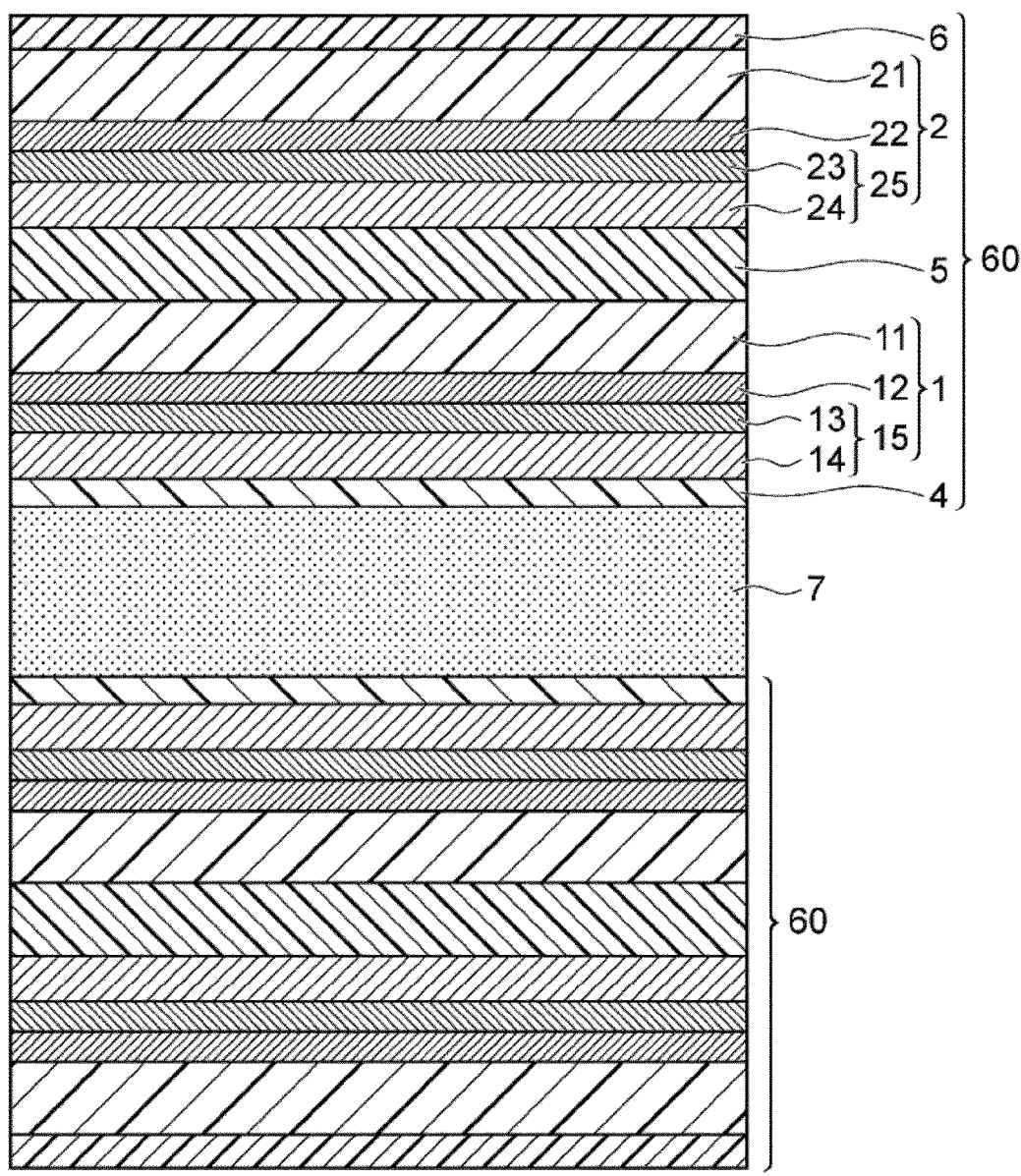
FIG. 9 is a schematic sectional view showing a further embodiment of a wavelength conversion sheet of the invention.

A wavelength conversion sheet 1200 shown in FIG. 9 has a structure wherein a phosphor layer 7 containing an epoxy resin and having a wavelength conversion function is sandwiched between a pair of barrier films 60. The barrier film 60 includes a first film 1, a second film 2, a primer layer 4, an adhesion layer 5, and a mat layer 6. The first film has a first substrate 11, an anchor layer 12, and a barrier layer 15 constituted of an inorganic thin film layer 13 and a gas barrier coating layer 14. The second film 2 includes a second substrate 21, an anchor coat layer 22, and a barrier layer 25 constituted of an inorganic thin film layer 23 and a barrier gas coating layer 24. The first film 1 and the second film 2 are laminated through an adhesion layer 5 so that the first substrate 11 and the gas barrier coating layer 24 are facing each other. In the gas barrier film 60, the primer layer 4 is disposed on the surface of the gas barrier coating layer 14 side of the first film 1 in contact with the gas barrier coating layer 14. The mat layer 6 is disposed on the surface of the second substrate 21 side of the second film 2 in contact with the second substrate 21. A pair of the barrier films 60 and a phosphor layer 7 are stacked in such a way that the primer layers 4 are each in contact with the phosphor layer 7. The wavelength conversion sheet 1200 having the structure shown in FIG. 9 is provided with the barrier films 60 wherein the two gas barrier films, i.e. the first and second films 1, 2, are laminated together, so that the transmission of moisture and oxygen can be more adequately suppressed. In the barrier film 60, the barrier layer 15 is disposed at the primer layer 4 side, or at a position nearer to the phosphor layer 7. Thus, the infiltration of moisture and oxygen into the phosphor layer 7 can be more adequately suppressed.

Figure 10:
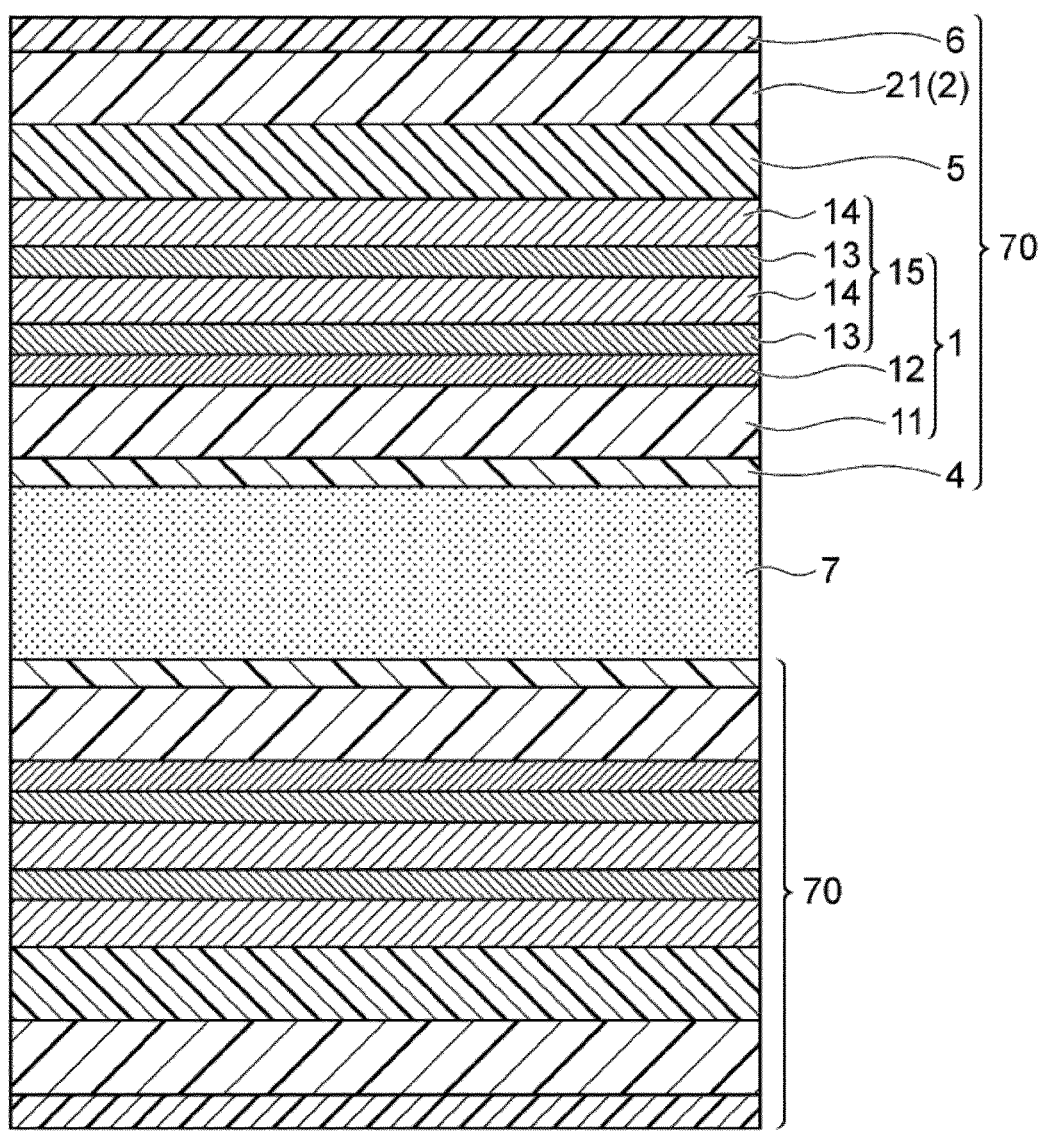
FIG. 10 is a schematic sectional view showing a still further embodiment of a wavelength conversion sheet of the invention.

A wavelength conversion sheet 1300 shown in FIG. 10 has a structure wherein a phosphor layer 7 containing an epoxy resin and having a wavelength conversion function is sandwiched between a pair of barrier films 70. The barrier film 70 includes a first film 1, a second film 2, a primer layer 4, an adhesion layer 5, and a mat layer 6. The first film includes a first substrate 11, an anchor coat layer 12, and a barrier layer 15 wherein two inorganic thin film layers 13 and two gas barrier coating layers are alternately stacked 14. The second film 2 is constituted of a second substrate 21 alone. The first film 1 and the second film 2 are laminated through the adhesion layer 5 so that the gas barrier coating layer 14 and the second substrate 21 are facing each other. In the barrier film 70, the primer layer 4 is disposed on the surface of the first substrate 11 side of the first film 1 in contact with the first substrate 11. The mat layer 6 is disposed on the surface of the second substrate 2 serving as the second film 2 at a side opposite to the adhesion layer 5 in contact with the second substrate 21. A pair of the barrier films 70 and a phosphor layer 7 are so stacked that the respective primer layers 4 are in contact with the phosphor layer 7. With the wavelength conversion sheet 1300 having the structure shown in FIG. 10, since the second film 2 is made up of the second substrate 21 alone, the simplification of the manufacturing procedure and cost reduction can be realized. Moreover, when the thickness of the second substrate 21 is appropriately changed, rigidity can be imparted to the barrier film 70, if necessary. Additionally, since the barrier layer 15 has such a structure that the two inorganic thin film layers 13 and the two gas barrier coating layers 14 are alternately stacked, gas barrier properties can be enhanced.

Figure 11:
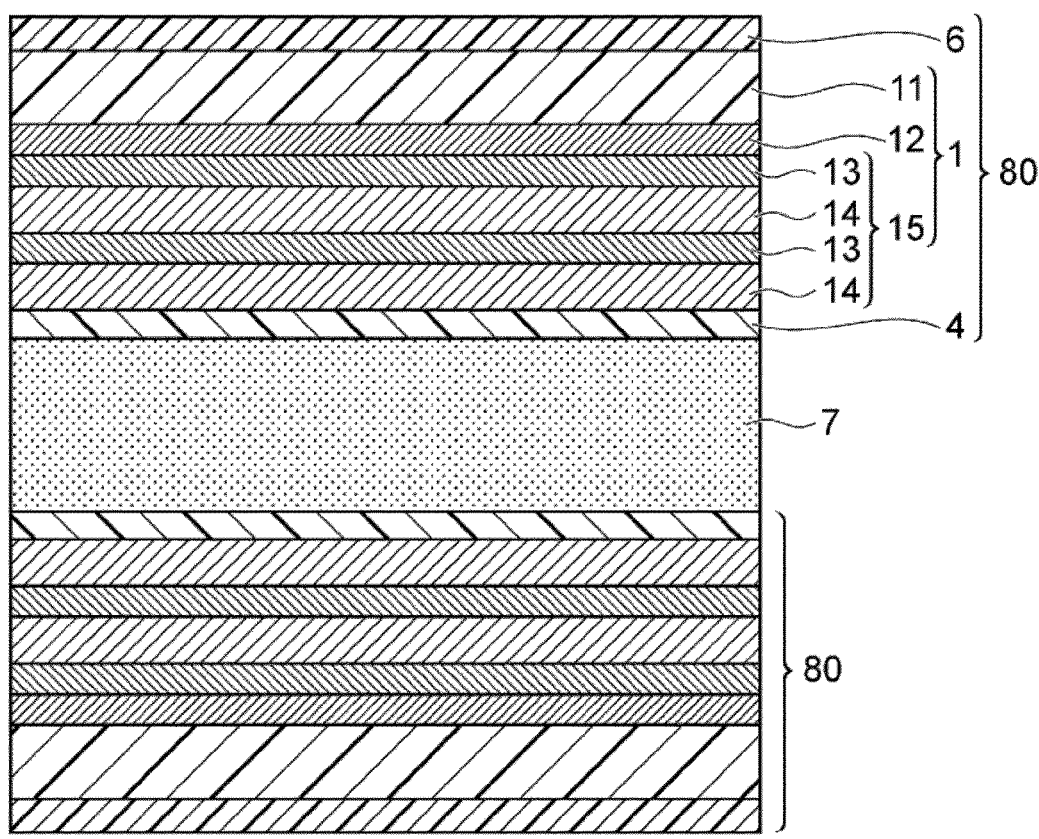
FIG. 11 is a schematic sectional view showing another embodiment of a wavelength conversion sheet of the invention.

A wavelength conversion sheet 1400 shown in FIG. 11 has such a structure that a phosphor layer 7 containing an epoxy resin and having a wavelength conversion function is sandwiched between a pair of barrier films 80. The barrier film 80 includes a first film 1, a primer layer 4, and a mat layer 6. The first film 1 has a first substrate 11, an anchor coat layer 12, and a barrier layer 15 wherein two inorganic thin film layers 13 and two gas barrier coating layers 14 are alternately stacked. In the barrier film 80, the primer layer 4 is disposed on the surface of the gas barrier coating layer 14 side of the first film 1 in contact with the gas barrier coating layer 14. The mat layer 6 is disposed on the surface of the first substrate 1 side of the first film 1 in contact with the first substrate 11. The pair of the barrier films 80 and the phosphor layer 7 are stacked in such a way that the respective primer layers 4 are in contact with the phosphor layer 7. Since the wavelength conversion sheet 1400 having the structure shown in FIG. 11 has neither a second film 2 nor an adhesion layer 5, the simplification of the manufacturing procedure, cost reduction and sheet thinning can be realized. Moreover, the barrier layer 15 has such a structure that the two inorganic thin film layers 13 and the two gas barrier coating layers 14 are alternately stacked, so that gas barrier properties can be enhanced.

Figure 12:
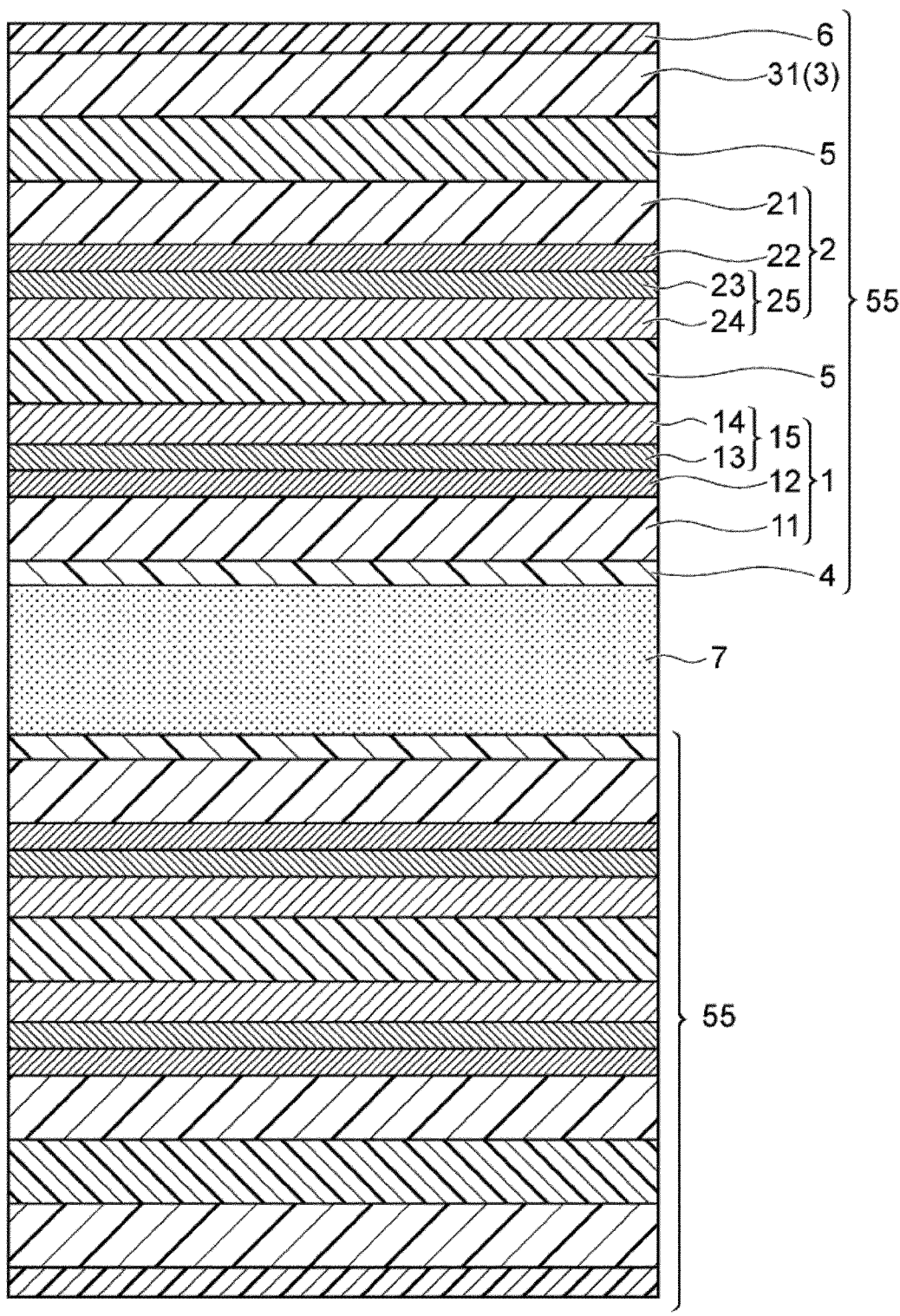
FIG. 12 is a schematic sectional view showing still another embodiment of a wavelength conversion sheet of the invention.

A wavelength conversion sheet 1500 shown in FIG. 12 has a structure wherein a phosphor layer 7 containing an epoxy resin and having a wavelength conversion function is sandwiched between a pair of barrier films 55. The barrier film 55 includes a first film 1, a second film 2, a third film 3, a primer layer 4, an adhesion layer 5, and a mat layer 6. The first film 1 includes a first substrate 11, an anchor coat layer 12, and a barrier layer 15 constituted of an inorganic thin film layer 13 and a gas barrier coating layer 14. The second film 2 includes a second substrate 21, an anchor coat layer 22, and a barrier layer 25 constituted of an inorganic thin film layer 23 and a gas barrier coating layer 24. The third film includes a third substrate 31 alone. The first film 1 and the second film 2 are laminated through the adhesion layer 5 so that the gas barrier coating layer 14 and the gas barrier coating layer 24 are facing each other. The second film 2 and the third film 3 are laminated through the adhesion layer 5 so that the second substrate 21 and the third substrate 31 are facing each other. In the barrier film 55, the primer layer 4 is disposed on the surface of the first substrate 11 side of the first film 1 in contact with the first substrate 11. The mat layer 6 is disposed on the surface of the third substrate 31, serving as the third film 3, opposite to the adhesion layer 5 side in contact with the third substrate 31. The pair of the barrier films 55 and the phosphor layer 7 are stacked so that the respective primer layers 4 are in contact with the phosphor layer 7. The wavelength conversion sheet 1500 having the structure shown in FIG. 12 includes the barrier films 55 wherein the two gas barrier films provided as the first and second films 1, 2 are laminated, so that the transmission of moisture and oxygen can be more adequately suppressed. Since the barrier layers 15, 25 in the barrier film 55 are disposed more inside than the first and second substrates 11, 21, the barrier layers 15, 25 are protected and thus the barrier layers 15, 25 are suppressed from being damaged prior to stacking with the phosphor layer 7. Moreover, since the barrier film 55 has the third film 3, the occurrence of wrinkles in the barrier film 55 can be suppressed. Additionally, when the thickness of the third substrate 31 is changed, rigidity can be imparted to the barrier film 55, if necessary.

Figure 13:
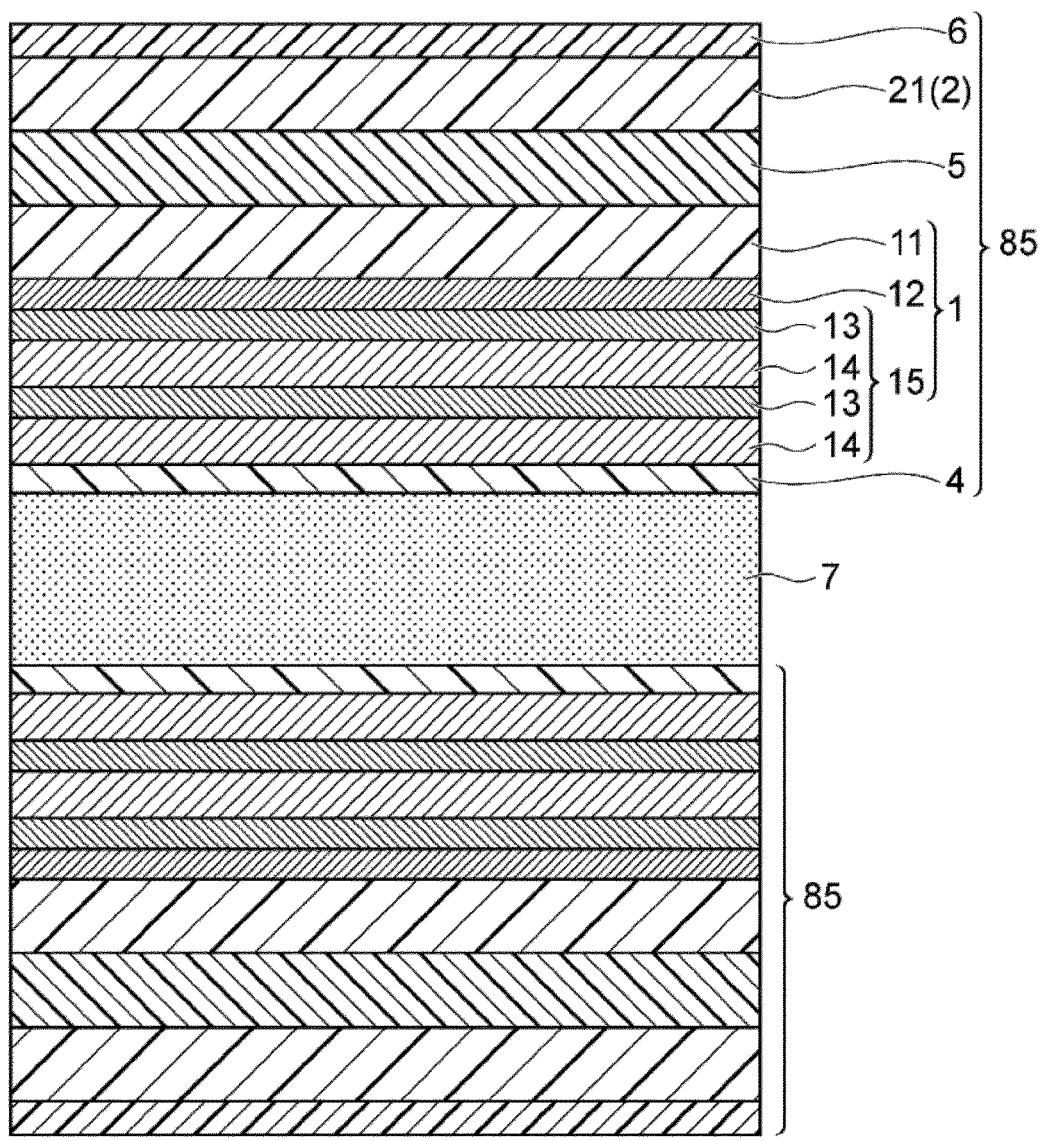
FIG. 13 is a schematic sectional view showing yet another embodiment of a wavelength conversion sheet of the invention.

A wavelength conversion sheet 1600 shown in FIG. 13 has a structure wherein a phosphor layer 7 containing an epoxy resin and a wavelength conversion function is sandwiched between a pair of barrier films 85. The barrier film 85 includes a first film 1, a second film 2, a primer layer 4, and a mat layer 6. The first film 1 includes a first substrate 11, an anchor coat layer 12, and a barrier layer 15 wherein two inorganic thin film layers 13 and two gas barrier coating films 14 are alternately stacked. The second film 2 is constituted of a second substrate 21 alone. The first film 1 and the second film 2 are laminated through the adhesion layer 5 so that the first substrate 11 and the second substrate 21 are facing each other. In the barrier film 85, the primer layer 4 is disposed on the surface of the gas barrier coating layer 14 side of the first film 1 in contact with the gas barrier coating layer 14. The mat layer 6 is disposed on the surface of the first substrate 11 side of the first film 1 in contact with the first substrate 11. The pair of the barrier films 85 and the phosphor layer 7 are so stacked that the primer layer 4 is in contact with the phosphor layer 7. A wavelength conversion sheet 1600 having the structure shown in FIG. 13 is such that the second film 2 is constituted of the second substrate 21 alone, with the result that the simplification of a manufacturing procedure and cost reduction can be realized. Moreover, when the thickness of the second substrate 21 is changed, rigidity can be imparted to the barrier film 85, if necessary. Since the barrier layer 15 has the structure wherein the two inorganic thin film layers 13 and the two gas barrier coating layers are alternately stacked, gas barrier properties can be enhanced.

The wavelength conversion sheets having such configurations as set out above have good gas barrier properties and are improved or even excellent in adhesion between the primer layer 4 and the phosphor layer 7. Eventually, even when the sheet is exposed to a high humidity environment over a long time, peeling between the phosphor layer 7 and the barrier film is suppressed from occurring. The primer layer 4 shows very good adhesion to both of the first substrate 11 and the gas barrier coating layer 14, so that peeling inside the barrier film can be well suppressed from occurring. Therefore, the wavelength conversion sheets having such configurations as described above can keep good gas barrier properties over a long time. In view of adhesion, the primer layer 4 is more preferably one that is coated onto the first substrate 11. Where the adhesion between the primer layer 4 and the first substrate 11 or the gas barrier coating layer 14 is poor, the adhesion with the primer layer 4 can be more improved by subjecting the first substrate 11 or the gas barrier coating layer 14 to corona treatment, flame treatment or plasma treatment.

The respective layers of the barrier film and the wavelength conversion sheet are now described in detail.

(Substrate)

The first, second and third substrates 11, 21, 31 are favorably a polymer film, respectively. The materials for the polymer film include, for example, polyesters such as polyethylene terephthalate, polybutylene terephthalate, polyethylene naphthalene and the like; polyamides such as nylons and the like; polyolefins such as polypropylene, cyclic olefin polymers and the like; polycarbonates; and triacetyl cellulose, etc., although not limited thereto. Preferably, the polymer film includes a polyester film, a polyamide film or a polyolefin film, of which a polyethylene terephthalate film or a polyamide film is more preferred. Much more preferably, mention is made of a polyethylene terephthalate film. The polyethylene terephthalate film is favorable from the standpoint of transparency, processing suitability and adhesion. In view of the transparency and gas barrier properties, a biaxially stretched polyethylene terephthalate film is preferred.

The polymer film may further contain, if necessary, additives such as an antistatic agent, an ultraviolet absorber, a plasticizer, a lubricant and the like. The polymer film may be subjected to corona treatment, flame treatment or plasma treatment on the surface thereof.

In the barrier film and the wavelength conversion sheet, where the first substrate 11 and the primer layer 4 are in contact with each other, the first substrate 11 should preferably have a polar functional group, such as a hydroxyl group or a carbonyl group, on the surface thereof. When the first substrate 11 has a polar functional group, such as a hydroxyl group or a carbonyl group, on the surface thereof, adhesion is more improved by reaction between the polar functional group such as a hydroxyl group and the silanol group generated by decomposition of an alkoxysilane of a silane coupling agent in the primer layer 4. Those polymer films having, on the surface thereof, a polar functional group such as a hydroxyl group or a carbonyl group include a polyethylene terephthalate film, a polybutylene terephthalate film, a polyethylene naphthalate film, a polyamide film, a triacetyl cellulose film, an acrylic film, a polycarbonate film and the like. If the first substrate 11 does not have a polar functional group, such as a hydroxyl group or a carbonyl group, on the surface thereof, adhesion with the primer layer 4 can be more improved by subjecting it to a surface treatment such as a flame treatment or a plasma treatment.

Although not specifically limited, the respective thicknesses of the first, second and third substrates 11, 21, 31 are preferably from 3 μm to 100 μm and more preferably from 5 μm to 50 μm from the standpoint of processability and productivity. When the thickness is not less than 3 μm, processing becomes easy. When the thickness is 100 μm or below, the lot productivity of the barrier film can be increased.

(Anchor Coat Layer)

The anchor coat layers 12, 22 are, respectively, provided between the first and second substrates 11, 21 and the inorganic thin film layers 13, 23 so as to improve the adhesion therebetween. The anchor coat layers 12, 22 may have barrier properties for preventing the transmission of moisture and oxygen.

The anchor coat layers 12, 22 can be, respectively, formed using, for example, a resin selected from a polyester resin, an isocyanate resin, a urethane resin, an acrylic resin, a polyvinyl alcohol resin, an ethylene-vinyl alcohol resin, a vinyl-modified resin, an epoxy resin, an oxazoline group-containing resin, a modified styrene resin, a modified silicone resin or an alkyl titanate. The anchor coat layers can be formed using the above-indicated resins singly or as a composite resin obtained by combination of two or more thereof.

The anchor coat layers 12, 22 can be formed by coating a solution containing such a resin as indicated above onto the first and second substrates 11, 21, followed by drying and curing, respectively. The coating method includes one using a gravure coater, a dip coater, a reverse coater, a wire bar coater, a die coater or the like.

The thicknesses of the anchor coat layers 12, 22 are preferably within a range of 5 to 500 nm, more preferably 10 to 100 nm, respectively. If the thickness is not less than 5 nm, the adhesion between the first and second substrates 11, 21 and the inorganic thin film layers 13, 23 and the barrier properties against moisture and oxygen tend to be improved. If below 500 nm, there is the tendency that a uniform layer wherein its internal stress is well suppressed can be formed.

(Barrier Layer)

The barrier layers 15, 25 are ones, which are provided to further improve water vapor and oxygen permeabilities. From the optical standpoint, the barrier layers 15, 25 should preferably have high transparency. The barrier layers 15, 25 may, respectively, be a single layer or a multilayer and are preferably ones having the inorganic thin film layers 13, 23 and the gas barrier coating layers 14, 24, respectively, as shown in FIGS. 1 to 13. Where the gas barrier coating layer 14 and the primer layer 4 are in contact with each other as is particularly shown in FIGS. 2, 4, 6, 9, 11 and 13, the gas barrier coating layer 14 should preferably have a siloxane bond. The presence of the siloxane bond in the gas barrier coating layer 14 leads to improved adhesion between the gas barrier coating layer 14 and the primer layer 4.

The barrier layers 15, 25 may be formed either in air or in vacuum. The vacuum film formation includes a physical vapor deposition method or a chemical vapor deposition method. The physical vapor deposition method includes a vacuum deposition method, a sputtering method, and an ion plating method. The chemical vapor deposition (CVD) method includes a thermal CVD method, a plasma CVD (PECVD) method and an optical CVD method. The film formation method may differ for the inorganic thin film layers 13, 23 and the gas barrier coating layers 14, 24.

(Inorganic Thin Film Layer)

The formation method of the inorganic thin film layers 13, 23 preferably includes a vacuum deposition method, a sputtering method or a PECVD method. A more preferred vacuum deposition method includes a resistance heating vacuum deposition method, an electron beam (electron beam) heating vacuum deposition method, and an induction heating vacuum deposition method. With the sputtering method, a reactive sputtering method and a dual magnetron sputtering method are more preferred. From the standpoint of film homogeneity, the sputtering method is preferred. From the standpoint of costs, the vacuum deposition method is preferred. These can be chosen depending on the purpose and use.

The plasma generation method in the sputtering method and the PECVD method includes those of a DC (Direct Current) type, an RF (Radio Frequency) type, an MF (Middle Frequency) type, a DC pulse type, and an RF superimposed DC type, for example.

With the vacuum film formation, there is usually formed a film of a metal, or an oxide, nitride or nitrided oxide such as of silicon. A preferred film for the inorganic thin film layers 13, 23 includes those of metals such as aluminum, titanium, copper, indium, tin and the like or oxides thereof (such as alumina), or silicon and silicon oxide. Aside from the oxides the of metals and silicon, nitrides and nitride oxides of the metals and silicon may be formed as the film. Additionally, films containing a plurality of metals may be formed. The oxides, nitrides and nitrided oxides of aluminum, copper, indium and silicon are improved or even excellent in both transparency and barrier properties. The oxides, nitrides and nitrided oxides of silicon are more preferred because of better barrier properties thereof.

The thicknesses of the inorganic thin film layers 13, 23 formed by the vacuum film formation are preferably within a range of not less than 5 nm to not larger than 100 nm, respectively. When the thickness of the respective inorganic thin film layer 13, 23 is not less than 5 nm, there is the tendency that better barrier properties are obtained. When the thickness of the respective inorganic thin film layers 13, 23 is not larger than 100 nm, there is the tendency that cracking is suppressed from occurring and the lowering of the water vapor and oxygen barrier properties due to the cracking can be avoided. Moreover, when the thickness of the respective inorganic thin film layers 13, 23 is not larger than 100 nm, cost reduction can be realized due to the reduction in amount of materials and the shortage of a film formation time, thus being good in economy.

(Gas Barrier Coating Layer)

The gas barrier coating layers 14, 24 are, respectively, provided so as to prevent secondary damages in subsequent steps and impart high barrier properties. The gas barrier coating layers 14, 24 may contain a siloxane bond. The gas barrier coating layers 14, 24 may be formed in air. Where the gas barrier coating films 14, 24 are formed in air, such films can be formed by coating, onto the inorganic thin film layers 13, 23, a coating solution containing, for example, a polar compound such as polyvinyl alcohol, polyvinylpyrrolidone or ethylene/vinyl alcohol copolymer, a chlorine-containing compound such as polyvinylidene chloride, or a compound containing a Si atom, a compound containing an Al atom or a compound containing a Zr atom, followed by drying and curing.

The method of coating the coating solution for forming the gas barrier coating films 14, 24 in the atmosphere particularly includes coating methods using a gravure coater, a dip coater, a reverse coater, a wire bar coater and a die coater.

A siloxane bond-containing compound is preferably one, which is formed by using, for example, a silane compound to cause reaction with the silanol group. Such a silane compound includes a compound represented by the following formula (1)

$$R^1_n(OR^2)_{4-n}Si \tag{1}$$

(wherein n is an integer of 0 to 3, and $R^1$ and $R^2$ independently represent a hydrocarbon group, preferably an alkyl group having 1 to 4 carbon atoms).

The compound represented by the above formula (1) includes, for example, tetramethoxysilane, tetraethoxysilane, tetrapropoxysilane, tetrabutoxysilane, methyltrimethoxysilane, methyltriethoxysilane, dimethyldimethoxysilane and dimethyldiethoxysilane.

For the gas barrier coating layers 14,24, there may be used materials that are prepared from precursors made of other metal atoms. As a Ti-containing compound, a compound represented by the following formula (2) can be mentioned, for example, $$R^1_n(OR^2)_{4-n}Ti \tag{2}$$

(wherein n is an integer of 0 to 3, and $R^1$ and $R^2$ independently represent a hydrocarbon group, preferably an alkyl group having 1 to 4 carbon atoms).

The compound represented by the general formula (2) includes, for example, tetramethoxy titanium, tetraethoxy titanium, tetraisopropoxy titanium and tetrabutoxy titanium.

A compound containing an Al atom includes, for example, those compounds represented by the following formula (3)

$$R^1_m(OR^2)_{3-m}Al \tag{3}$$

(wherein m is an integer of 0 to 2, and $R^1$ and $R^2$ independently represent a hydrocarbon group, preferably an alkyl group having 1 to 4 carbon atoms).

The compound represented by the above formula (3) includes, for example, trimethoxy aluminum, triethoxy aluminum, triisopropoxy aluminum and tributoxy aluminum.

A compound containing a Zr atom includes, for example, those compounds represented by the following formula (4)

$$R^1_n(OR^2)_{4-n}Zr \tag{4}$$

(wherein n is an integer of 0 to 3, and $R^1$ and $R^2$ independently represent a hydrocarbon group, preferably an alkyl group having 1 to 4 carbon atoms).

The compound represented by the above formula (4) includes, for example, tetramethoxy zirconium, tetraethoxy zirconium, tetraisopropoxy zirconium and tetrabutoxy zirconium.

Where the gas barrier coating layers 14, 24 are formed in air, the above coating solution is cured after coating. The curing method is not specifically limited and includes UV curing and thermal curing. With the UV curing, the coating solution may contain a polymerization initiator and a compound having a double bond. If necessary, thermal aging may be carried out.

Other usable method of forming the gas barrier coating layers 14, 24 in air is one wherein a reaction product, which is obtained by mutual dehydration condensation of particles of an inorganic oxide of a metal, such as magnesium, calcium, zinc, aluminum, silicon titanium, zirconium or the like, through the phosphorus atom derived from phosphorus compound, is formed as a gas barrier coating layer. More particularly, the functional group (e.g. a hydroxyl group) present on the surface of the inorganic oxide undergoes condensation reaction with the site of a phosphorus compound reactive with the inorganic oxide (e.g. a halogen atom directly bound to the phosphorus atom or an oxygen atom directly bound to the phosphorus atom), thus causing binding therebetween. The reaction product can be obtained by coating a coating solution containing the inorganic oxide and the phosphorus compound onto the surface of the respective inorganic thin film layers 13, 23 and subjecting the coated film to thermal treatment, thereby permitting the particles of the inorganic oxide to undergo mutual binding reaction through the phosphorus atom derived from the phosphorus compound. The lower limit of the thermal treatment temperature is not lower than 110° C., preferably not lower than 120° C., more preferably not lower than 140° C. and much more preferably not lower than 170° C. If the thermal treatment temperature is lower, difficulty is involved in obtaining a satisfactory reaction speed, thereby causing the lowering of productivity. A preferred upper limit of the thermal treatment temperature may differ depending on the type of substrate material and is not higher than 220° C., preferably not higher than 190° C. The thermal treatment can be performed in air, in an atmosphere of nitrogen, or in an atmosphere of argon.

Where the gas barrier coating layers 14, 24 are formed in air, respectively, the above-mentioned coating solution may further contain a resin so far as coagulation is not caused to occur. Specific examples of the resin include an acrylic resin, a polyester resin and the like. Preferably, the coating solution is such that a resin that has high affinity for other materials in the coating solution should be contained selected from those resins.

The coating solution may further contain, if necessary, a filler, a levelling agent, a defoaming agent, a UV absorber, an antioxidant, and a silane coupling agent and a titanium chelating agent.

The thickness of the respective gas barrier coating layers 14, 24 formed in air is preferably from 50 nm to 2000 nm, more preferably from 100 to 1000 nm, in terms of thickness after curing. When the thicknesses of the gas barrier coating layers 14, 24 to be formed in air are not less than 50 nm, film formation tends to become easy. When the thicknesses of the gas barrier layers 14, 24 are not larger than 2000 nm, cracking or curling tends to be suppressed.

(Adhesive Layer)

The adhesive layer 5 is provided between the first film 1 and the second film 2 so as to stack the first film 1 and the second film 2 by lamination as shown in FIGS. 1 to 3, 5 to 10 and 12 to 13. As is particularly shown in FIGS. 5 and 12, where the barrier film has the third film 3, the adhesion layer is also provided between the second film 2 and the third film 3 for stacking the second film 2 and the third film 3 by lamination. For the adhesion layer 5, ordinary adhesives or pressure-sensitive adhesives for polymer film can be used and can be appropriately chosen depending on the lamination surfaces of the first film 1 and the second film 2. The candidate material for the adhesion layer 5 includes epoxy, polyester, acrylic, rubber, phenol and urethane adhesives or pressure-sensitive adhesives.

The coating method of the adhesive or pressure-sensitive adhesives include those coating methods using a gravure coater, a dip coater, a reverse coater, a wire bar coater and a die coater.

The thickness of the adhesion layer 5 is preferably from 1 μm to 20 μm. When the thickness of the adhesive layer 5 is not less than 1 μm, adequate adhesion tends to be obtained. When below 20 μm, there is the tendency that the total thickness of the barrier film can be made thin and a cost rise can be suppressed.

After lamination of the first film 1 and the second film 3 or of the second film 2 and the third film 3 through the adhesion layer 5, aging can be performed. The aging is performed, for example, at 20 to 80° C. for 1 to 10 days.

If necessary, the adhesion layer 5 may further contain a curing agent, an antistatic agent, a silane coupling agent, a US absorber, an antioxidant, and a dispersant.

(Primer Layer)
(Primer Layer Related to a First Aspect)

The primer layer 4 related to the first aspect is one provided for improving adhesion between the barrier film and an adherend such as a phosphor layer. The primer layer 4 is disposed on the first substrate 11 of the first film or the gas barrier coating layer 14. The primer layer 4 is provided on one outermost surface of the barrier film and the surface of the barrier film at the primer layer 4 side is laminated with the adherend.

The primer layer 4 is one, which is made of a cured product of a primer composition containing at least one organometallic compound selected from the group consisting of a metal chelating compound, a metal alkoxide compound and a metal acylate compound, and a silane coupling agent.

Although not specifically limited, the silane coupling agent preferably includes those having at least one functional group selected from the group consisting of a vinyl group, an epoxy group, a styryl group, a methacrylic group, an acrylic group, an amino group, an isocyanurate group, a ureido group, a mercapto group, a sulfide group and an isocyanate group. These functional groups should preferably be selected depending on the type of component for an adherend. For example, where the adherend contains an epoxy resin, it is preferred from the standpoint of adhesion to use a silane coupling agent having at least one functional group selected from the group consisting of an amino group, a mercapto group, a sulfide group, an epoxy group and a ureido group. Where the adherend contains an acrylic resin, it is preferred in view of adhesion to use a silane coupling agent having at least one functional group selected from the group consisting of an amino group, a mercapto group, a sulfide group, an epoxy group, a methacrylic group, an isocyanate group and an isocyanurate group. The silane coupling agents may be used in combination of two or more silane coupling agents having different functional groups.

Examples of the silane coupling agent having a vinyl group include vinyltrimethoxylsilane, vinyltriethoxysilane, vinyltris (2-methoxyethoxy) silane, vinylmethyldimethoxysilane, 3-acryloxypropylsilane and the like. Of these, vinyltrimethoxysilane and vinylmethyldimethoxysilane are preferred from the standpoint of reactivity. These may be used singly or in combination of two or more.

Examples of the silane coupling agent having an epoxy group include 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane and the like. Of these, 3-glycidoxypropylmethyldimethoxysilane and 3-glycidoxypropyltrimethoxysilane are preferred from the standpoint of reactivity. These may be used singly or in combination of two or more.

Examples of the silane coupling agent having a styryl group include p-styryltrimethoxysilane and the like.

Examples of the silane coupling agent having a methacrylic group include 3-methacryloxypropylmethyldimethoxysilane, 3-methacryloxypropyltrimethoxysilane, 3-metharyloxypropylmethyldiethoxysilane, 3-methacryloxypropyltriethoxysilane and the like. Of these, 3-methacryloxypropylmethyldimethoxysilane and 3-methacryloxypropyltrimethoxysilane are preferred in view of reactivity. These may be used singly or in combination of two or more.

Examples of the silane coupling agent having an acrylic group include 3-acryloxypropyltrimethoxysilane and the like.

Examples of the silane coupling agent having an amino group include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene) propylamine, N-phenyl-3-aminopropyltrimethoxysilane, N-(vinylbenzyl)-2-aminoethyl-3-aminopropyltrimethoxysilane hydrochloride and the like. Of these, 3-aminopropyltriethoxysilane and 3-aminopropyltriethoxysilane are preferred in view of reactivity. These may be used singly or in combination of two or more.

Examples of the silane coupling agent having an isocyanurate group include tris-(trimethoxysilylpropyl)isocyanurate and the like.

Examples of the silane coupling agent having a ureido group include 3-ureidopropyltriethoxysilane and the like.

Examples of the silane coupling agent having a mercapto group include 3-mercaptopropylmethyldimethoxysilane, 3-mercaptopropyltrimethoxysilane and the like. Of these, 3-mercaptopropyltrimethoxysilane is preferred in view of reactivity. The silane coupling agent having a mercapto group may include those silane coupling agents wherein the mercapto group is protected, for example, with an alkoxysilyl group or the like while taking its offensive odor into account. These may be used singly or in combination of two or more.

Examples of the silane coupling agent having a sulfide group include bis(triethoxysilylpropyl)tetrasulfide, 3-octanoylthio-1-propyltriethoxysilane and the like. Of these, bis(triethoxysilylpropyl)tetrasulfide is preferred in view of reactivity. These may be used singly or in combination of two or more.

Examples of the silane coupling agent having an isocyanate group include 3-isocyanatopropyltriethoxysilane, 3-isocyanatopropyltrimethoxysilane and the like. Of these, 3-isocyanatopropyltrimethoxysilane is preferred in view of reactivity. These may be used singly or in combination of two or more.

The organometallic compound used is at least one member selected from the group consisting of a metal chelating compound, a metal alkoxide compound and a metal acylate compound. Of these, the metal chelating compound and the metal alkoxide compound are preferred in view of the reactive promotion of hydrolysis. The organometallic compound should preferably contain at least one metal selected from the group consisting of aluminum, zirconium, titanium and tin. Of these, the organometallic compound should preferably contain at least one metal selected from the group consisting of aluminum, zirconium and titanium from the aspect of environment, and should preferably contain at least one metal selected from the group consisting of zirconium and titanium from the standpoint that especially good initial adhesion is ensured. From the standpoint that especially good adhesion after aging is ensured it is preferred that at least metal selected from the group consisting of zirconium and aluminum is contained, and from the standpoint that both initial adhesion and adhesion after aging are made good, it is preferred that zirconium is contained.

Examples of the metal chelating compound include zirconium ethyl acetoacetate, zirconium tributoxy monoacetylacetonate, zirconium tetraacetylacetonate, zirconium dibutoxy bis(ethylacetoacetate), zirconium monoacetylacetonate, titanium diisopropoxy bis(acetylacetonate), titanium tetraacetylacetonate, titanium diisopropoxy bis(ethylacetoacetate), titanium di-2-ethylhexoxy bis(2-ethyl-3-hydroxyhexoxide), titanium diisopropoxy bis(triethanol aminate), titanium-1,3-propanedioxy bis(ethylacetoacetate), titanium aminoethylaminoethanolate, titanium acetylacetonate, titanium ethylacetoacetate, a titanium phosphate compound, titanium octylene glycolate, titanium ethylacetoacetate, aluminum trisethylacetoacetate, aluminum trisacetylacetoacetate, aluminum bisethylacetoacetate monoacetylacetonate and the like. Of these, it is preferred from solubility in organic solvent to use zirconium tributoxy monoacetylacetonate, zirconium tetraacetylacetonate, zirconium dibutoxy bis(ethylacetoacetate), titanium diisopropoxy bis(ethylacetoacetate), titanium di-2-ethylhexoxy bis(2-ethyl-3-hydroxyhexoxide), titanium diisopropoxy bis(triethanol aminate), titanium-1,3-propoanedioxy bis(ethylacetoacetate), titanium aminoethylaminoethanolate, titanium diisopropoxy bis(acetylacetonate), titanium tetraacetylacetonate and aluminum bisethylacetoacetate monoacetylacetonate. These may be used singly or in combination of two or more.

Examples of the metal alkoxide compound include zirconium tetra-n-propoxide, n-propyl zirconate, n-butyl zirconate, titanium tetra-n-butoxide, titanium butoxide dimer, titanium tetra-2-ethylhexoxide, titanium tetra-isopropoxide, tertiary aluminum titanate, tetra-t-butyl titanate, tetraisopropyl titanate, tetra-n-butyl titanate, butyl titanate dimer, tetraoctyl titanate, tetraisopropyl titanate, tetrastearyl titanate, aluminum isopropoxide, aluminum s-butoxide and the like. Of these, it is preferred from the standpoint of solubility in organic solvent to use zirconium tetra-n-propoxide, titanium tetra-n-butoxide, titanium butoxide dimer, titanium tetra-2-ethylhexoxide, titanium tetraisopropoxide, tertiary aluminum titanate, tetra-t-butyltitanate and aluminum tri-sec-butoxide. These may be used singly or in combination of two or more.

Examples of the metal acylate compound include a zirconium octenoate compound, zirconium stearate, titanium isostearate and the like. These may be used singly or in combination of two or more.

Of the organometallic compounds described above, it is preferred to use metal chelating compounds from the standpoint of controlling a pot life after preparation of solution.

The number of carbon atoms of the organometallic compound is preferably from 2 to 120, more preferably from 6 to 72. If the number of carbon atoms is within the above range, the pot life after preparation of solution can be easily controlled.

In the primer composition, the formulation ratio (mass ratio) between the silane coupling agent and the organometallic compound is preferably at 100:1 to 1:100, more preferably at 10:1 to 1:10. If the amount of the organometallic compound is less than the above range, there may be the case that not only it takes a long time to form the primer layer 4, but also the suppression effect of tackiness lowers. On the other hand, when the amount of the organometallic compound is larger than the above range, a silane coupling agent in the primer layer 4 after film formation becomes insufficient in amount, with concern that adhesion to an adherend such as a phosphor layer may lower.

The primer composition used to form the primer layer 4 may further contain components other than the silane coupling agent and the organometallic compound. Other components include a diluent solvent, a slipping agent, a deforming agent, an antistatic agent and the like.

The diluent solvent includes toluene, methyl ethyl ketone, ethyl acetate, butyl acetate, hexane, 1-butanol, isopropyl alcohol, water and the like. These may be used singly or in combination of two or more. Although not specifically limited, the amount of the diluent solvent is generally 0 to 99.9 mass %, preferably 70 to 98 mass %, based on the total amount of the primer composition. If the diluent solvent is smaller in amount, reactivity increases with some concern that the resulting coating solution is gelled. On the contrary, if the diluent solvent is larger in amount, the resulting coating solution increases in cost.

(Sealant Layer Related to the Second Aspect)

The primer layer 4 related to the second aspect is one that improves adhesion between the barrier film and the phosphor layer 7 and is provided to prevent peeling between the barrier film and the phosphor layer 7 even when exposed to a high humidity environment over a long time. The primer layer 4 is provided on the first substrate 11 of the first film 1 or on the gas barrier coating layer 14.

The primer layer 4 is one that is made of a cured product of a primer composition containing a silane coupling agent having an amino group.

Although not specifically limited, the silane coupling agent having an amino group includes, for example, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride and the like. Of these, 3-aminopropyltriethoxysilane and N-2-(aminoethyl)-3-aminopropylmethyldimethoxysilane are preferred in view of solution stability. These may be used singly or in combination of two or more.

The primer composition used to form the primer layer 4 may further contain components other than the silane coupling agent having an amino group. Other components include organometallic compounds such as an organozirconium compound and an organotitanium compound, a silane coupling agent other than a silane coupling agent t having an amino group (i.e. an amino group-free silane coupling agent), a diluent solvent, a slipping agent, a defoaming agent, an antistatic agent and the like.

Although not specifically limited, the organometallic compound includes, for example, zirconium ethyl acetoacetate, zirconium tetracetylacetonate, zirconium monoacetylacetonate, n-propyl zirconate, n-butyl zirconate or the like. Of these, zirconium tetracetylacetonate is preferred from the standpoint of stability and reactivity. These may be used singly or in combination of two or more. To contain the organometallic compound in the primer composition leads to improve film formation of the primer layer 4. As the organometallic compound, those ones having been illustrated with reference to the primer layer related to the first aspect may also be used.

In the primer composition, the formulation ratio (ratio by mass) between the silane coupling agent having an amino group and the organometallic compound is preferably from 100:0 to 20:80, more preferably from 95:5 to 40:60. If the formulation amount of the organometallic compound is larger than the above range, there may be some cases that the primer layer 4 after film formation becomes brittle in nature and adhesion between the barrier film and the phosphor layer 7 lowers.

The silane coupling agent other than the amino group-containing silane coupling agent includes those silane coupling agents having at least one functional group selected from the group consisting of an epoxy group, a vinyl group, a styryl group, a methacrylic group, an acrylic group, an isocyanurate group, a ureido group, a mercapto group, a sulfide group and an isocyanate group. Of these, the silane coupling agent having an epoxy group is preferred in view of adhesion. These may be used singly or in combination of two or more. When a silane coupling agent other than the amino group-containing silane coupling agent is contained in the primer composition, adhesion to a variety of epoxy resin compositions can be improved.

Examples of the silane coupling agent having an epoxy resin include 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane and the like. Of these, 3-glycidoxypropylmethyldimethoxysilane is preferred in view of stability and reactivity. These may be used singly or in combination of two or more.

Specific and preferred examples of the silane coupling agent other than the amino group-containing silane coupling agent include those described with reference to the primer layer related to the first aspect.

In the primer composition, the formulation ratio (ratio by mass) of the amino group-containing silane coupling agent and the silane coupling agent other than the amino group-containing silane coupling agent is preferably from 100:0 to 20:80, more preferably from 100:0 to 40:60. If the silane coupling agent other than the amino group-containing silane coupling agent is larger than the above range, there may be some cases that adhesion between the barrier layer and the phosphor layer 7 lowers.

The diluent solvent used can be ones described with reference to the primer layer related to the first aspect and its formulation amount is as having stated before.

The primer layer 4 related to the first and second aspects can be formed by coating such a primer composition as stated above onto the first substrate 11 of the first film 1 or the gas barrier coating layer 14, followed by curing. The coating method includes ones using a gravure coater, a dip coater, a reverse coater, a wire bar coater and a die coater. The curing can be performed under conditions of 80 to 150° C. and 15 seconds to 300 seconds.

The thickness of the primer layer 4 related to the first and second aspects is preferably from 1 to 1000 nm, more preferably from 1 to 400 nm, even more preferably from 1 to 200 nm, much more preferably from 5 to 100 nm, and most preferably from 10 to 80 nm. If the thickness is not less than 1 nm, the film formation after coating is stabilized and good adhesion can be uniformly obtained in the plane. On the other hand, when the thickness is not larger than 1000 nm, the primer layer 4 is prevented from becoming brittle and stable adhesion with the phosphor layer 7 can be obtained. Further, the infiltration of moisture and oxygen from the end portions (area between the barrier film and an adherend or phosphor layer 7) of the primer layer 4 can be adequately suppressed. A thinner primer layer 4 leads to a faster curing reaction of the primer layer 4 and also to better initial adhesion with an adherend or phosphor layer 7. When the primer layer 5 is not larger than 400 nm in thickness, better initial adhesion is likely to be obtained when compared with the case that the thickness exceeds 400 nm. Additionally, when the thickness of the primer layer 4 is not larger than 200 nm, an optical interference fringe can be reduced.

(Mat Layer)

The mat layer 6 is provided on the surface of the barrier film opposite to the primer layer 4 so as to show one or more optical functions and antistatic functions. Although not specifically limited, the optical function includes an anti-interference (anti-fringe) function, an antireflective function, a diffusion function and the like. Of these, the mat layer 6 should preferably have at least an anti-interference function as an optical function. In the present embodiment, the case that the mat layer 6 has at least an anti-interference function is illustrated.

The mat layer 6 may be formed to contain a binder resin and fine particles. The fine particles may be so incorporated in the binder resin as to be partly exposed from the surface of the mat layer 6, thereby causing fine irregularities in the surface of the mat layer 6. The provision of such a mat layer 6 on the barrier film enables the occurrence of an interference fringe such as Newton's ring to be more adequately prevented. As a result, there can be obtained a wavelength conversion sheet having high efficiency, high precision and long life.

Those resins, which are excellent in optical transparency, can be used as a binder resin although not specifically limited. More specific examples include thermoplastic resins such as a polyester resin, an acrylic resin, an acrylic urethane resin, a polyester acrylate resin, a polyurethane acrylate resin, a urethane resin, an epoxy resin, a polycarbonate resin, a polyamide resin, a polyimide resin, a melamine resin, a phenolic resin and the like, thermosetting resins, and ionizing radiation curing resins. Aside from the organic resins, a silica binder can be used. Of these, it is preferred in view of a variety in type to use acrylic resins and urethane resins. Because of the excellence of light fastness and optical characteristics, the use of acrylic resins is more preferred. These may be used singly or in combination of two or more.

The fine particles are not specifically limited and include, for example, aside from inorganic particles of silica, clay, talc, calcium carbonate, calcium sulfate, barium sulfate, titanium oxide, alumina and the like, organic particles of a styrene resin, a urethane resin, a silicone resin, an acrylic resin, a polyamide resin and the like. Of these, it is preferred in view of transmittance to use fine particles made of silica, an acrylic resin, a urethane resin and a polyamide resin and having a refractive index of 1.40 to 1.55. Fine particles whose refractive index is low is expensive. On the other hand, fine particles whose refractive index is too high tend to impair transmittance. These may be used singly or in combination of two or more.

The average particle size of the fine particles is preferably from 0.1 to 30 μm, more preferably from 0.5 to 10 μm. When the average particle size is not less than 0.1 μm, an excellent interference fringe preventing function tends to be obtained. If below 30 μm, transparency tends to be more improved.

The content of the fine particles in the mat layer 6 is preferably from 0.5 to 30 mass %, more preferably from 3 to 10 mass %, based on the total amount of the mat layer 6. When the content of the fine particles is not less than 0.5 mass %, there is the tendency that a light diffusion function and an effect of preventing occurrence of an interference fringe are more improved. When the content is not larger than 30 mass %, the reduction of luminance does not occur.

The mat layer 6 can be formed by coating a coating solution containing such a resin binder and fine particles as described above onto the surface of the first film 1, the second film 2 or the third film 3, followed by drying and curing. The coating method includes those methods using a gravure coater, a dip coater, a reverse coater, a wire bar coater, a die coater and the like.

The thickness of the mat layer 6 is preferably from 0.1 to 20 μm, more preferably from 0.3 to 10 μm. When the thickness of the mat layer 6 is not less than 0.1 μm, there is the tendency that a uniform film is likely to be obtained and a satisfactory optical function is likely to be well obtained. On the other hand, when the mat layer 6 is not larger than 20 μm in thickness, the fine particles are exposed on the surface of the mat layer 6 with the tendency that an irregularity-imparting effect is likely to be obtained.

Among the barrier films of the present embodiment having such configurations as set out above, the barrier film related to the first aspect can be used for applications that require barrier properties concerning the transmission of oxygen and water vapor. For instance, such a barrier film can be used as a wavelength conversion sheet including a phosphor used for liquid crystal backlight, particularly a wavelength conversion sheet containing a quantum dot phosphor, an organic EL element, a solar cell and the like barrier films for industry.

(Phosphor Layer)

The phosphor layer 7 is one having a wavelength conversion function enabling the emission of light having a different wavelength depending on the irradiation of excited light and contains at least one type of phosphor (not shown). The phosphor layer 7 related to the second aspect should contain an epoxy resin. Since the phosphor layer 7 contains an epoxy resin, there can be obtained improved or even excellent adhesion with the primer layer 4.

A nanosized semiconductor called quantum dots among phosphors is preferred because it ensures a high wavelength conversion efficiency and is excellent in luminance and color reproducibility upon use as a display. The quantum dots include ones wherein a light-emitting core is covered with a shell serving as a protective film. The core includes, for example, one made of cadmium selenide (CdSe). The shell includes, for example, one made of zinc sulfide (ZnS). When the surface defects of the CdSe particles are covered with ZnS having a great band gap, the quantum efficiency is increased. The phosphor may be one wherein a core is doubly covered with a first shell and a second shell. In this case, CdSe can be used as the core, zinc selenide (ZnS) used as the first shell, and ZnS used as the second shell. The phosphors are used in combination of two or more. Alternatively, a phosphor layer containing one type of phosphor alone and another phosphor layer containing other type of phosphor alone may be stacked.

The quantum dots are dispersed in a resin material for sealing.

In the first aspect, usable resin materials (sealing resins) include, for example, a thermoplastic resin, a thermosetting resin, and a UV curable resin (photocurable resin). Examples of the thermoplastic resin include cellulose derivatives such as acetyl cellulose, nitro cellulose, acetyl-butyl cellulose, ethyl cellulose and methyl cellulose; vinyl resins such as a vinyl acetate resin and its copolymers, a vinyl chloride resin and its copolymers and a vinylidene chloride resin and its copolymers; acetal resins such as polyvinyl formal and polyvinylbutyral; acrylic resins such as an acrylic resin and its copolymers, and a methacrylic resin and its copolymers; polystyrene resins; polyamide resins; linear polyester resins; fluorine resins; and polycarbonate resins. The thermosetting resin includes, epoxy resins, phenolic resins, urea-melamine resins, polyester resins, and silicone resins. The photocurable resins include photocurable prepolymers such as epoxy acrylates, urethane acrylates and polyester acrylates. Additionally, there may be used ones comprised of a major proportion of these photocurable prepolymers and a monofunctional or polyfunctional monomer serving as a diluent.

In the second aspect, the resin material should contain at least an epoxy resin. The resin materials other than the epoxy resin include an ink paste binder resin such as a polyvinyl-butyral resin, a polyvinyl acetal resin, a phenolic resin, a melamine resin or the like. Besides, an adhesive material functioned as a binder resin mentioned below may also be used.

The adhesive material functioned as a binder resin includes, for example, a urea resin, a melamine resin, a phenolic resin, a resorcinol resin, an epoxy resin, a polyurethane resin, a polyimide resin, a polybenzimidazole resin, a polyester resin, a vinyl acetate resin, a polyvinyl acetal resin, polyvinyl alcohol, a vinyl chloride resin, a cyano acrylate material, a polyether acrylate material, polyethylene, a cellulosic material, a chloroprene rubber, a nitrile rubber, an SBR rubber, an SIS rubber, a polysulfide resin, a butyl rubber, a silicone rubber, a vinyl phenolic resin, an epoxy phenolic resin, a chloroprene phenolic resin, a nitrile phenolic resin, a nylon epoxy resin, a nitrile epoxy resin and the like. As the resin material, an epoxy resin may be use singly or in combination with one or more other resin materials.

The phosphor layer 7 can be formed by coating a mixed solution containing a phosphor, a resin material and, if necessary, a solvent onto the primer layer 4 of the barrier film 4 to form a coated film and, if required, stacking a differently prepared barrier film in such a way that the primer layer 4 is facing with the phosphor layer 7, followed by curing the coated film.

In the first aspect, the curing of the coated film can be appropriately performed depending the type of resin material used. For example, where the resin material is a photocurable resin, the curing of the coated film can be carried out by irradiation of UV light thereby curing (UV curing) the photocurable resin. It will be noted that the photocurable resin may be further thermally cured after the UV curing.

In the second aspect, the curing of the coated film is not specifically limited. For example, curing can be performed under conditions of 15 to 100° C. and 10 minutes to 24 hours.

The wavelength conversion sheet of the present embodiment can be used, for example, in a backlight unit. The backlight unit includes, for example, a light source, a light guide plate, a reflection plate, and the wavelength conversion sheet of the present embodiment. In the backlight unit, the light guide plate and the reflection plate are disposed on one surface of the wavelength conversion sheet in this order, and the light source is disposed in a lateral direction of the light guide plate (in the surface direction of the light guide plate). The light source used is, for example, a blue light emitting diode element.

[Methods for Making the Barrier Film and the Wavelength Conversion Sheet]

Next, embodiments of methods for manufacturing the barrier film and the wavelength conversion sheet of the present invention are now described.

(Manufacturing Method Related to the First Aspect)

The method of manufacturing the barrier film related to the first aspect of the present embodiment is a method of manufacturing a barrier film including a gas barrier film and a primer layer disposed on one outermost surface of the film. The method has the step of forming the primer layer by coating and curing, onto the gas barrier film, a primer composition containing at least one organometallic compound selected from the group consisting of a metal chelating compound, a metal alkoxide compound and a metal acylate compound, and a silane coupling agent. The method of manufacturing a wavelength conversion sheet according to the first aspect of the present embodiment wherein the wavelength conversion sheet includes a phosphor layer containing a phosphor, and a barrier film stacked on at least one surface of the phosphor layer and having a gas barrier film and a primer layer formed on an outermost surface of the phosphor layer side, the method comprising the steps of coating and curing, onto the gas barrier film, a primer composition containing at least one organometallic compound selected from the group consisting of a metal chelating compound, a metal alkoxide compound and a metal acrylate compound, and a silane coupling agent thereby forming a primer layer, and stacking the phosphor layer and the barrier film. In this embodiment, the surface of the gas barrier film, on which the primer layer is formed, is the first substrate 11 for the barrier films 100, 300 and 500 shown in FIGS. 1, 3, 5 and the gas barrier coating layer 14 for the barrier films 200, 400 and 600 shown in FIGS. 2, 4, 6.

Where the barrier film 100 shown in FIG. 1 and the wavelength conversion sheet 800 shown in FIG. 7 are prepared, they can be prepared according to the following procedure, for example. It will be noted that the forming method of the respective layers are just as described before. Initially, a first film 1 and a second film 2 are prepared, respectively. More particularly, an anchor coat layer 12 is formed on a first substrate 11, on which an inorganic thin film layer 13 and a gas barrier coating layer 14 are successively formed to provide the first film 1. The second film 2 can be likewise prepared.

An adhesive or pressure-sensitive adhesive is applied onto the gas barrier coating layer 14 of the thus obtained first film 1 and laminated with the gas barrier coating layer 24 side of the second film 2, followed by aging to obtain a laminate film wherein the first film 1 and the second film 2 are laminated through the adhesive 5. The lamination can be performed by use of an ordinary lamination apparatus. It will be noted that the adhesive or pressure-sensitive adhesive may be coated onto the gas barrier coating layer 24 of the second film 2.

A primer composition containing at least one organometallic compound selected from the group consisting of a metal chelating compound, a metal alkoxide compound and a metal acrylate compound, and a silane coupling agent is coated onto the first substrate 11 of thus obtained laminate film, followed by curing to form a primer layer 4. Moreover, a mat layer 6 is formed on the second substrate 21 of the laminate film. The formation order of the primer layer 4 and the primer layer 6 is not restricted. The mat layer 6 may be preliminarily formed on the second substrate 21 of the second film 2 prior to the lamination of the first film 1 and the second film 2. Moreover, the primer layer 4 may be preliminarily formed on the substrate 11 of the first film 1 prior to the lamination between the first film 1 and the second film 2. In this way, the barrier film 100 is obtained. Two barrier films 100 are prepared.

Next, a mixed solution containing a phosphor and a resin material and, if necessary, a solvent is coated onto the primer layer 4 of one of the barrier films 100 to form a coated film, on which the primer layer 4 side of the other barrier film 100 is laminated, followed by curing to form a phosphor layer 7. By the method described above, there can be obtained a wavelength conversion sheet 800 of the present embodiment, which has good gas barrier properties and improved or even excellent adhesion between the barrier film 100 and the phosphor layer 7.

(Manufacturing Method Related to the Second Aspect)

The manufacturing method of a wavelength conversion sheet according to the second aspect of the present embodiment is one wherein the wavelength conversion sheet includes a phosphor layer containing an epoxy resin and a phosphor, and a barrier film stacked on at least one surface of the phosphor layer and having a primer layer on the outermost surface of the phosphor layer side, the method comprising the steps of coating a primer composition containing a silane coupling agent having an amino group onto an underlying layer for primer layer in the barrier film and curing to form a primer layer, and stacking the phosphor layer and the barrier film. The underlying layer for primer layer in the barrier film means the first substrate 11 for the barrier films 50, 70 and 55 shown in FIGS. 8, 10 and 12 and the gas barrier coating layer 14 for the barrier films 60, 80 and 85 shown in FIGS. 9, 11 and 13.

Figure 8:
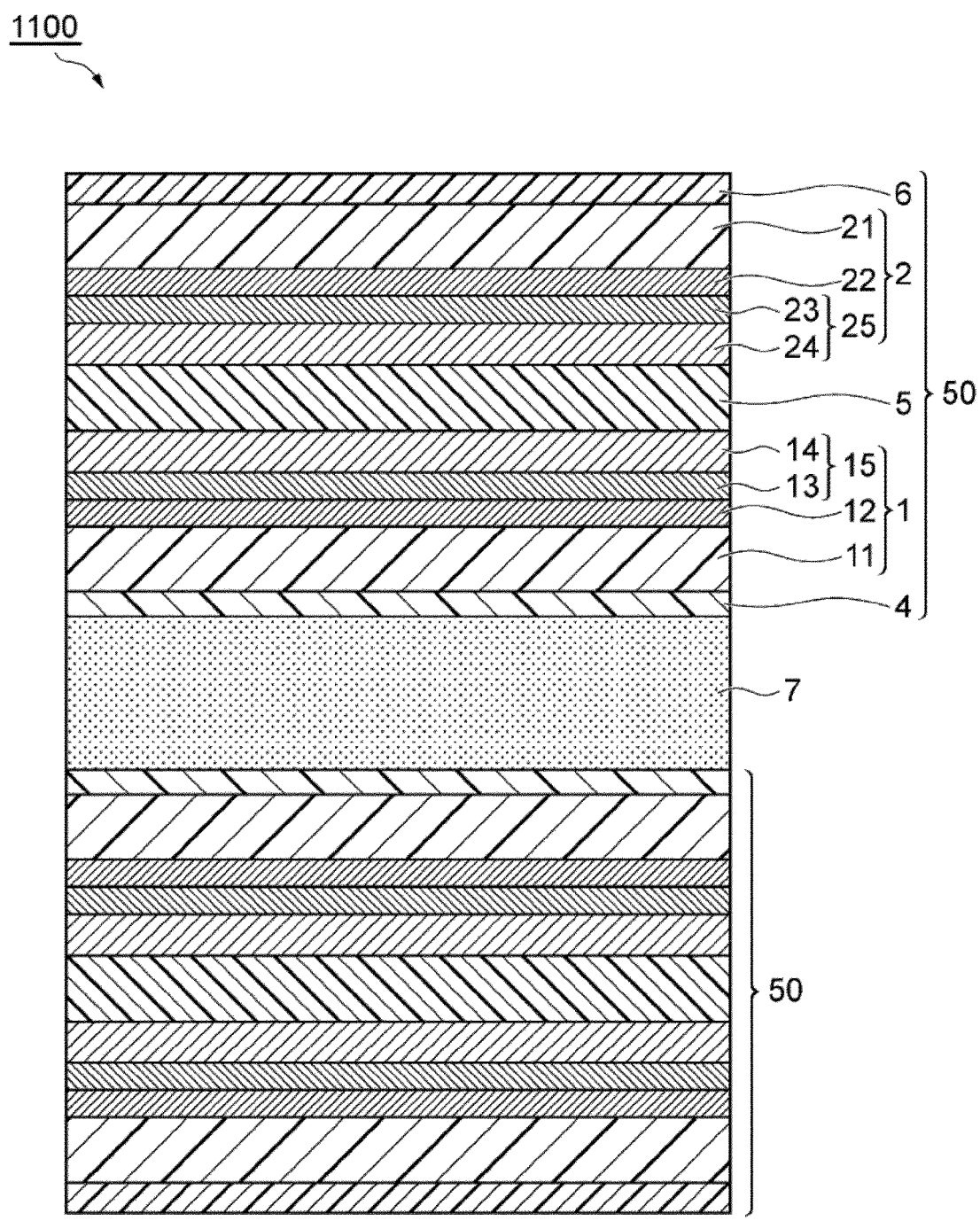
FIG. 8 is a schematic sectional view showing another embodiment of a wavelength conversion sheet of the invention.

The wavelength conversion sheet 1100 shown in FIG. 8 can be manufactured, for example, according to the following procedure. It will be noted that the forming method of the respective layers are just as described hereinbefore. Initially, a first film 1 and a second film 2 are prepared, respectively. More particularly, an anchor coat layer 12 is formed on a first substrate 11, on which an inorganic thin film layer 13 and a gas barrier coating layer 14 are successively formed to prepare the first film 1. The second film 2 can be likewise prepared.

An adhesive or pressure-sensitive adhesive is coated onto the gas barrier coating layer 14 of the thus obtained first film 1 and laminated with the gas barrier coating layer 24 side surface of the second film 2, followed by aging to obtain a laminate film wherein the first film 1 and the second film 2 are laminated through the adhesive layer 5. The lamination can be performed by use of an ordinary lamination apparatus. It will be noted that the adhesive or pressure-sensitive adhesive may be coated onto the gas barrier coating layer 24 of the second film 2.

A primer composition containing a silane coupling agent having an amino group is coated onto the first substrate 11 of the resulting laminate film and cured to form a primer layer 4. A mat layer 6 is formed on the second substrate 21 of the laminate film. The formation order of the primer layer 4 and the mat layer 6 is not specifically restricted. The mat layer 6 may be preliminarily formed on the second substrate 21 of the second film 2 prior to the lamination between the first film 1 and the second film 2. Moreover, the primer layer 4 may be preliminarily formed on the first substrate 11 of the first film 1 prior to the lamination between the first film 1 and the second film 2. In this way, a barrier film 50 is obtained. Two barrier films 50 are prepared.

Next, a mixed solution containing a phosphor, a resin material containing an epoxy resin and, if necessary, a solvent is coated onto the primer layer 4 of one of the barrier films 50 to form a coated film, on which other barrier film 50 is laminated at the primer layer 4 side thereof, followed by curing to form a phosphor layer 7. Upon the formation of the phosphor layer 7, the amino group contained in the primer layer 4 and the epoxy resin contained in the coated film react with each other thereby ensuring improved or even excellent adhesion between the primer layer 4 and the phosphor layer 7. According to the method described above, there can be obtained a wavelength conversion sheet 1100 of the present embodiment, which has good gas barrier properties and is improve or even excellent in adhesion between the barrier film 50 and the phosphor layer 7.

The preferred embodiments of the present invention have been described in detail in the foregoing. The technical concept of the present invention should not be construed as limited to these embodiments and many alterations may be possible within the range not departing from the spirit of the present invention.

For instance, in the barrier films and wavelength conversion sheets shown in FIGS. 1 to 13, the mat layer 6 and the anchor coat layers 12, 22 may not be provided.

In the barrier films 100, 200 and 500 shown in FIGS. 1, 2, 5 and 7 and the wavelength conversion sheets 1100, 1200, 1500 shown in FIGS. 8, 9 and 12, respectively, the barrier layers 15, 25 may be ones wherein the inorganic thin film layers 13, 23 and the gas barrier coating layers 14, 24 are alternately and plurally stacked, respectively. In the barrier films 300, 400 and 600 shown in FIGS. 3, 4 and 6 and the wavelength conversion sheets 1300, 1400 and 1600 shown in FIGS. 10, 11 and 13, respectively, the barrier layers 15, 25 may be ones wherein the inorganic thin film layers 13, 23 and the gas barrier coating layers 14, 24 are stacked singly, respectively.

In the barrier films shown in FIGS. 1 to 13, the directions of the first film 1 and the second film 2 are not limited to those indicated in the figures and may be disposed in opposite directions.

The barrier films shown in FIGS. 1 to 13 may further include, aside from the first to third films shown in the respective figures, one or more films each having the same configuration as or a configuration different from the films shown in the respective figures.

In the wavelength conversion sheets shown in FIGS. 7 to 13, a pair of the barrier films sandwiching the phosphor layer 7 therebetween may have mutually different configurations. Moreover, the mat layer 6 may not necessarily be provided on the opposite surfaces of the wavelength conversion sheet, but may be provided only on one surface.

EXAMPLES

The present invention is more particularly described by way of examples and comparative examples and the invention should not be construed as limited to the following examples.

It will be noted that in the following examples and comparative examples, a water vapor transmission rate was measured according to an infrared sensor method prescribed in JIS K7129 using a water vapor transmission rate measuring device (commercial name: Permatran, manufactured by MOCON Inc.) under conditions that the temperature of a transmission cell was set at 40° C., a relative humidity of a high humidity chamber was set at 90% RH, and a relative humidity of a low humidity chamber was set at 0% RH.

In the following examples and comparative examples, the thickness of primer layer was measured by observing the section of a sample with a transmission electron microscope (Transmission Electron Microscope; TEM).

Example 1-1

A polyester resin solution was coated onto a corona discharge treated surface of a biaxially stretched polyethylene terephthalate film whose one surface was treated by corona discharge (commercial name: P60, thickness: 16 μm, manufactured by Toray Limited) and dried and cured at 80° C. for 1 minute to form a 100 nm thick anchor coat layer.

Using a vacuum deposition apparatus of an electron beam heating type, a silicon oxide material (manufactured by Canon Optron Inc.) was evaporated by heating with an electron beam under a pressure of $1.5 \times 10^{-2}$ Pa to form an 80 nm thick SiOx film serving as an inorganic thin film layer on the anchor coat layer. It is to be noted that the acceleration voltage in the deposition was 40 kV and the emission current was 0.2 A. A coating solution of a hydrolyzate of tetraethoxysilane (containing a siloxane bond) and polyvinyl alcohol at a mixing ratio by mass of 1:1 was coated onto the SiOx film by a bar coating method, and dried and cured at 120° C.

for 1 minute to form a 400 nm thick gas barrier coating layer. In this way, a first film was obtained. In the same manner as with the first film, a second film was prepared. The first and second films had a water vapor transmission rate of 0.1 g/(m$^2$·day), respectively.

A pressure-sensitive adhesive (main agent: TPO-3183, curing agent: K-341, manufactured by Saiden Chemical Industry Co., Ltd.) was applied onto the gas barrier coating layer of the first film to form an adhesion layer, followed by lamination with the second film at the gas barrier coating layer side thereof, followed by aging at 25° C. for 7 days. Thus, the first film and the second film were laminated through the adhesion layer to obtain a laminate film. The thickness of the adhesion layer was 4 μm.

A primer layer was subsequently formed on the polyethylene terephthalate film (first substrate) of the first film of the thus obtained laminate film according to the following procedure.

A primer composition was prepared by mixing 1.0 part by mass of 3-glycidoxypropylmethyldimethoxysilane (epoxy-based silane coupling agent, available from Shin-Etsu Chemical Co. Ltd., under the commercial name of KBM-402), 1.0 part by mass of zirconium tetraacetylacetonate (zirconium chelate, available from Matsumoto Fine Chemical Co., Ltd., under the commercial name of OlgaChicks ZC-700), and 22.2 parts by mass of toluene serving as a diluent solvent. The thus prepared primer composition was coated onto the first substrate of the first film by means of a wire bar (#3) and dried and cured at 120° C. for 30 seconds to form a 70 nm thick primer layer.

A coating solution of 100 parts by mass of an acrylic polyol resin (commercial name: Acrydic A-814, manufactured by DIC Corporation), 8.5 parts by mass of an isocyanate curing agent (commercial name: Burnock DN-980, hexamethylenediisocyanate compound, manufactured by DIC Corporation), 10 parts by mass of fine particles (polyurethane with an average particle size of 2 μm), and 70 parts by mass of a solvent (ethyl acetate) was coated onto the polyethylene terephthalate (second substrate) of the second film, followed by heat drying and curing to form a 3 μm thick mat layer. In this way, a barrier film was obtained. Two barrier films having the same configuration as described above were prepared.

A coating solution for the formation of phosphor layer was prepared by dispersing, in an acrylic resin (commercial name: Hitaroid 7927-15, manufactured by Hitachi Chemical Co., Ltd.), a quantum dot phosphor having a particle size of 6 nm and made of a cadmium selenide (CdSe) core and a zinc sulfide (ZnS) shell. This coating solution was coated onto the primer layer of one of the barrier films to form a coated film, followed by lamination on the primer layer of the other barrier film. The coated film was cured by exposure to light at an exposure amount of 1200 mJ/cm$^2$ by use of a UV irradiation device thereby forming a phosphor layer having a wavelength conversion function. In this way, there was obtained a wavelength conversion sheet having such a configuration as shown in FIG. 7. The thickness of the phosphor layer was found to be 100 μm.

Example 1-2

A wavelength conversion sheet was obtained in the same manner as in Example 1-1 except that the primer layer was formed according to the following procedure.

A primer composition was prepared by mixing 1.0 part by mass of 3-methacryloxypropyltrimethoxysilane (methacrylic silane coupling agent, commercial name: KBM-503, manufactured by Shin-Etsu Chemical Co., Ltd.), 1.0 part by mass of zirconium tetracetylacetonate (zirconium chelate, commercial name: OlgaChicks ZC-700, manufactured by Matsumoto Fine Chemical Co., Ltd.), and 22.2 parts by mass of toluene serving as a diluent solvent. The thus prepared primer composition was coated onto the first substrate of the first film by means of a wire bar (#3) and dried and cured at 120° C. for 30 seconds to form a 70 nm thick primer layer.

Example 1-3

A wavelength conversion sheet was obtained in the same manner as in Example 1-1 except that the phosphor layer was formed according to the following procedure.

A coating solution for the formation of phosphor layer was prepared by dispersing a quantum dot phosphor having a particle size of 6 nm and made of a cadmium selenide (CdSe) core and a zinc sulfide (ZnS) shell in a mixture of an epoxy compound (commercial name RM12B4791A, manufactured by Epic Resins Inc.) and an amine compound (commercial name RM12B4791B, manufactured by Epic Resins Inc.) with a ratio by mass of 2:1. This coating solution was coated onto the primer layer of one of the barrier films to form a coated film, followed by lamination on the primer layer of the other barrier film. The coated film was cured by exposure to light at an exposure amount of 2100 mJ/cm$^2$ by use of a UV irradiation device, followed by heat curing at 110° C. for 15 minutes thereby forming a phosphor layer having a wavelength conversion function. In this way, there was obtained a wavelength conversion sheet having such a configuration as shown in FIG. 7. The thickness of the phosphor layer was found to be 100 μm.

Comparative Example 1-1

A wavelength conversion sheet was obtained in the same manner as in Example 1-1 except that the primer layer was formed according to the following procedure.

A primer composition was prepared by mixing 2.0 part by mass of 3-glycidoxypropylmethyldimethoxysilane (epoxy silane coupling agent, commercial name: KBM-402, manufactured by Shin-Etsu Chemical Co., Ltd.), and 18.9 parts by mass of toluene serving as a diluent solvent. The thus prepared primer composition was coated onto the first substrate of the first film by means of a wire bar (#3) and dried and cured at 120° C. for 30 seconds to form a 70 nm thick primer layer.

A wavelength conversion sheet was obtained in the same manner as in Example 1-1 except that the primer layer was formed according to the following procedure.

A primer composition was prepared by mixing 2.0 part by mass of 3-methacryloxypropyltrimethoxysilane (methacrylic silane coupling agent, commercial name: KBM-503, manufactured by Shin-Etsu Chemical Co., Ltd.), and 18.9 parts by mass of toluene serving as a diluent solvent. The thus prepared primer composition was coated onto the first substrate of the first film by means of a wire bar (#3) and dried and cured at 120° C. for 30 seconds to form a 70 nm thick primer layer.

A wavelength conversion sheet was obtained in the same manner as in Comparative Example 1-1 except that the phosphor layer was formed according to the following procedure.

A coating solution for the formation of phosphor layer was prepared by dispersing a quantum dot phosphor having a particle size of 6 nm and made of a cadmium selenide (CdSe) core and a zinc sulfide (ZnS) shell in a mixture of an epoxy compound (commercial name RM12B4791A, manufactured by Epic Resins Inc.) and an amine compound (commercial name RM12B4791B, manufactured by Epic Resins Inc.) with a ratio by mass of 2:1. This coating solution was coated onto the primer layer of one of the 5 barrier films to form a coated film, followed by lamination on the primer layer of the other barrier film. The coated film was cured by exposure to light at an exposure amount of 2100 mJ/cm$^2$ by use of a UV irradiation device, followed by heat curing at 110° C. for 15 minutes thereby forming a phosphor layer having a wavelength conversion function. In this way, there was obtained a wavelength conversion sheet having such a configuration as shown in FIG. 7. The thickness of the phosphor layer was found to be 100 μm.

<Evaluation of Peeling Strength>

The wavelength conversion sheets obtained in the examples and comparative examples were each cut into a 1 cm wide strip, and the thus cut wavelength conversion strip was fixed on a glass plate. The primer layer of the thus fixed strip-shaped wavelength conversion sheet was peeled off from the phosphor layer by use of a Tensilon universal testing machine (manufactured by A & D Engineering, Inc.) at a speed of 300 mm/minute in a direction vertical to the glass plate to measure strength required for the peeling. The results of the measurement are shown in Table 1.

<Evaluation of Blocking>

The barrier films having the primer layer and obtained in the examples and comparative examples were each cut into 10 cm square pieces. The pieces were superposed one on another so that the mat surface and the primer surface were facing each other, followed by storage in a heat circulating oven of 60° C. for 1 week in the condition that a load of 1N was applied thereon by use of a permanent set testing machine CO-201 of a constant load type (Tester Sangyo Co. Ltd.) to evaluate blocking. The results of evaluation on the presence or absence of blocking by visual observation are shown in Table 1.

<Evaluation of Relative Luminance>

The wavelength conversion sheets obtained in the examples and comparative examples were each cut into 10 cm square pieces, followed by placing on a blue light backlight unit and measuring an initial luminance by use of ultra low luminance spectroradiometer SR-UL2 (manufactured by Topcon Co., Ltd.). The resulting sample was stored in a heat circulating oven of 85° C. for 500 hours, followed by measuring the luminance in a similar way. The luminance after the storage over 500 hours was divided by the initial luminance to evaluate a relative luminance. The results of the measurement are shown in Table 1.

As will be apparent from the results of Table 1, it has been confirmed that the wavelength conversion sheets of Examples 1-1 to 1-3 have excellent adhesion and handling properties.

Example 2-1

A polyester resin solution was coated, by a bar coating method, onto a corona discharge-treated surface of a biaxially stretched polyethylene terephthalate film (commercial name: P60, thickness 16 μm, manufactured by Toray Ltd.) whose one surface had been treated with corona discharge, followed by drying and curing at 80° C. for 1 minute to form a 100 nm thick anchor coat layer.

Using a vacuum deposition apparatus of an electron beam heating type, a silicon oxide material (manufactured by Canon Optron Inc.) was evaporated by heating with an electron beam under a pressure of $1.5 \times 10^{-2}$ Pa to form an 80 nm thick SiOx film serving as an inorganic thin film layer on the anchor coat layer. It is to be noted that the acceleration voltage in the deposition was 40 kV and the emission current was 0.2 A. A coating solution of a hydrolyzate of tetraethoxysilane (containing a siloxane bond) and polyvinyl alcohol at a mixing ratio by mass of 1:1 was coated onto the SiOx film by a bar coating method, and dried and cured at 120° C. for 1 minute to form a 400 nm thick gas barrier coating layer. In this way, a first film was obtained. In the same manner as with the first film, a second film was prepared. The first and second films had a water vapor transmission rate of 0.1 g/(m$^2$-day), respectively.

A pressure-sensitive adhesive (main agent: TPO-3183, curing agent: K-341, manufactured by Saiden Chemical Industry Co., Ltd.) was applied onto the gas barrier coating layer of the first film, followed by lamination with the second film at the gas barrier coating layer side thereof, followed by aging at 25° C. for 7 days. Thus, the first film and the second film were laminated through the adhesion layer to obtain a laminate film. The thickness of the adhesion layer was 4 μm.

A primer layer was formed on the polyethylene terephthalate film (first substrate) of the first film of the thus obtained laminate film according to the following procedure.

A primer composition, which was obtained by diluting 3-aminopropyltriethoxysilane (amino-based silane coupling agent, commercial name: KBE-903, manufactured by Shin-Etsu Chemical Co. Ltd.,) with ethyl acetate to a solid content of 1.5 mass %, was applied onto the first substrate of the first film by use of a wire bar #3, followed by drying and curing at 120° C. for 1 minute to form a 30 nm thick primer layer.

TABLE 1

| | Primer layer | | Type of resin | Peeling | | Evaluation |
|---|---|---|---|---|---|---|
| | Type of silane coupling agent | Organometallic compound | in phosphor layer | strength (N/cm) | Evaluation of blocking | of relative luminance |
| Ex. 1-1 | epoxy-based agent | zirconium chelate | acrylic-based resin | 2.9 | no | 1.10 |
| Ex. 2-1 | methacrylic-based agent | zirconium chelate | acrylic-based resin | 2.0 | no | 0.99 |
| Ex. 1-3 | epoxy-based agent | zirconium chelate | epoxy/amine-based resin | 3.0 | no | 1.05 |
| Comp. Ex. 1-1 | epoxy-based agent | — | acrylic-based resin | 1.2 | yes | 0.95 |
| Comp. Ex. 1-2 | methacrylic-based agent | — | acrylic-based resin | 0.9 | yes | 0.93 |
| Comp. Ex. 1-3 | epoxy-based agent | — | epoxy/amine-based resin | 1.5 | yes | 0.94 |

A coating solution of 100 parts by mass of an acrylic polyol resin (commercial name: Acrydic A-814, manufactured by DIC Corporation), 8.5 parts by mass of an isocyanate curing agent (commercial name: Burnock DN-980, hexamethylene diisocyanate compound, manufactured by DIC Corporation), 10 parts by mass of fine particles (polyurethane with an average particle size of 2 μm), and 70 parts by mass of a solvent (ethyl acetate) was coated onto the polyethylene terephthalate (second substrate) of the second film, followed by heat drying and curing to form a 3 μm thick mat layer. In this way, a barrier film was obtained. Two barrier films having the same configuration as described above were prepared.

A material, which was obtained by dispersing, in a thermosetting epoxy resin, a quantum dot phosphor having a particle size of 6 nm and made of a cadmium selenide (CdSe) core and a zinc sulfide (ZnS) shell, was dropped over the primer layer of one of the barrier films, followed by lamination on the primer layer of the other barrier film.

The resulting laminate was allowed to stand at room temperature for 24 hours to cure the thermosetting epoxy resin thereby forming a phosphor layer having a wavelength conversion function to obtain a wavelength conversion sheet having such a configuration as shown in FIG. 8. The thickness of the phosphor layer was found to be 100 μm.

Example 2-2

A wavelength conversion sheet was obtained in the same manner as in Example 2-1 except that the primer layer was formed in a thickness of 100 nm according to the following procedure.

A primer composition, which was obtained by diluting 3-aminopropyltriethoxysilane (amine-based silane coupling agent, commercial name: KBE-903, manufactured by Shin-Etsu Chemical Co., Ltd.) with ethyl acetate to a solid content of 5 mass %, was coated onto the first substrate of the first film by means of a wire bar #3 and dried and cured at 120° C. for 1 minute to form a 100 nm thick primer layer.

Example 2-3

A wavelength conversion sheet was obtained in the same manner as in Example 2-1 except that the primer layer was formed in a thickness of 500 nm according to the following procedure.

A primer composition, which was obtained by diluting 3-aminopropyltriethoxysilane (amine-based silane coupling agent, commercial name: KBE-903, manufactured by Shin-Etsu Chemical Co., Ltd.) with ethyl acetate to a solid content of 25 mass %, was coated onto the first substrate of the first film by means of a wire bar #3 and dried and cured at 120° C. for 1 minute to form a 500 nm thick primer layer.

A wavelength conversion sheet was obtained in the same manner as in Example 2-1 except that the primer layer was formed in a thickness of 5 nm according to the following procedure.

A primer composition, which was obtained by diluting 3-aminopropyltriethoxysilane (amine-based silane coupling agent, commercial name: KBE-903, manufactured by Shin-Etsu Chemical Co., Ltd.) with ethyl acetate to a solid content of 0.25 mass %, was coated onto the first substrate of the first film by means of a wire bar #3 and dried and cured at 120° C. for 1 minute to form a 5 nm thick primer layer.

Example 2-5

A wavelength conversion sheet was obtained in the same manner as in Example 2-1 except that the primer layer was formed in a thickness of 100 nm according to the following procedure.

A primer composition having a solid content of 5 mass % was prepared by mixing 100 parts by mass of 3-aminopropyltriethoxysilane (amine-based silane coupling agent, commercial name: KBE-903, manufactured by Shin-Etsu Chemical Co., Ltd.), 100 parts by mass of zirconium tetracetylacetonate (commercial name: OlgaChickes ZC-700, manufactured by Matsumoto Fine Chemical Co., Ltd.) and 2200 parts by mass of ethyl acetate. The thus prepared primer composition was coated onto the first substrate of the first film by means of a wire bar #3 and dried and cured at 120° C. for 1 minute to form a 100 nm thick primer layer.

Example 2-6

A polyester resin solution was coated, by a bar coating method, onto a corona discharge-treated surface of a biaxially stretched polyethylene terephthalate film (commercial name: P60, thickness 16 m, manufactured by Toray Ltd.) whose one surface had been treated with corona discharge, followed by drying and curing at 80° C. for 1 minute to form a 100 nm thick anchor coat layer.

Using a vacuum deposition apparatus of an electron beam heating type, a silicon oxide material (manufactured by Canon Optron Inc.) was evaporated by heating with an electron beam under a pressure of $1.5 \times 10^{-2}$ Pa to form an 80 nm thick SiOx film serving as an inorganic thin film layer on the anchor coat layer. It will be noted that the acceleration voltage in the deposition was 40 kV and the emission current was 0.2 A. A coating solution of a hydrolyzate of tetraethoxysilane (containing a siloxane bond) and polyvinyl alcohol at a mixing ratio by mass of 1:1 was coated onto the SiOx film by a bar coating method, and dried and cured at 120° C. for 1 minute to form a 400 nm thick gas barrier coating layer. Next, an 80 nm thick SiOx film serving as an inorganic thin film layer was formed on the gas barrier coating layer in the same manner as described above. In this way, a first film was obtained. The first film had a water vapor transmission rate of 0.008 g/m$^2$-day.

A pressure-sensitive adhesive (main agent: TPO-3183, curing agent: K-341, manufactured by Saiden Chemical Industry Co., Ltd.) was applied onto the gas barrier coating layer of the first film to form an adhesion layer, followed by lamination with a corona discharge-treated surface of a biaxially stretched polyethylene terephthalate film (commercial name: FE2001, thickness: 25 μm, manufactured by Futamura Chemical Co., Ltd., water vapor transmission rate: 25 g/m$^2$-day) serving as a second film and aging at 25° C. for 7 days. In this way, there was obtained a laminate film wherein the first film and the second film were laminated through the adhesion layer. The thickness of the adhesion layer was 4 μm.

Thereafter, a 30 nm thick primer layer was formed on the polyethylene terephthalate film (the first substrate) of the first film of the laminate film in the same manner as in Example 2-1.

Further, a 3 μm thick mat layer was formed on the polyethylene terephthalate film (second substrate) of the second film in the same manner as in Example 2-1 to obtain a barrier film. Two barrier films having the same configuration as described above were prepared.

A wavelength conversion film having such a configuration as shown in FIG. 10 was obtained in the same manner as in Example 2-1 using the barrier films obtained in a manner as described above.

Example 2-7

In Example 2-1, the first substrate of the first film and the barrier layer were reversed with respect to the order of the disposition. More particularly, the first substrate side of the first film was placed in face-to-face relation with the adhesion layer, and the primer layer was formed on the gas barrier coating layer. Except the above changes, a wavelength conversion film having such a configuration as shown in FIG. 9 was obtained in the same manner as in Example 2-1.

Example 2-8

A first film was prepared in the same manner as in Example 2-6. A 30 nm thick primer layer was formed on the gas barrier coating layer of the thus prepared first film in the same manner as in Example 2-1.

A 3 μm thick mat layer was formed on the polyethylene terephthalate film (first substrate) of the first film in the same manner as in Example 2-1. In this way, a barrier film was obtained. Two barrier films having the same configuration were prepared.

A wavelength conversion sheet having such a configuration as shown in FIG. 11 was obtained in the same manner as in Example 2-1 using the barrier films obtained in a manner as described above.

Comparative Example 2-1

A wavelength conversion sheet was obtained in the same manner as in Example 2-1 except that a primer layer was not formed.

Comparative Example 2-2

A wavelength conversion sheet was obtained in the same manner as in Example 2-1 except that a primer layer was formed in a thickness of 30 nm according to the following procedure.

A primer composition obtained by diluting 3-methacryloxypropylmethyldimethoxysilane (methacrylic-based silane coupling agent, commercial name: KBM-502, manufactured by Shin-Etsu Chemical Co., Ltd.) with ethyl acetate to a solid content of 1.5 mass % was applied onto the first substrate of the first film by use of a wire bar #3 and dried and cured at 120° C. for 1 minute to form a 30 nm thick primer layer.

Comparative Example 2-3

A wavelength conversion sheet was obtained in the same manner as in Example 2-1 except that the phosphor layer was formed according to the following procedure.

A material, which was obtained by dispersing a quantum dot phosphor made of a cadmium selenide (CdSe) core and a zinc sulfide (ZnS) shell and having a particle size of 6 nm in a thermosetting acrylic resin, was dropped over the primer layer of one of the barrier films, followed by lamination with the primer layer of the other barrier film.

The thermosetting acrylic resin was cured by allowing to stand at room temperature for 24 hours to form a phosphor layer having a wavelength conversion function thereby obtaining a wavelength conversion sheet. The thickness of the phosphor layer was found to be 100 μm.

The results of measurement of a water vapor transmission rate of the barrier films prepared in the above examples and comparative examples are collectively shown in Table 2.
<Evaluation of Adhesion>

The wavelength conversion sheets obtained in the above examples and comparative examples were each cut into a 1 cm wide strip, and the thus cut wavelength conversion strip was fixed on a glass plate. The primer layer of the thus fixed strip-shaped wavelength conversion sheet was peeled off from the phosphor layer by use of a Tensilon universal testing machine (manufactured by A & D Engineering, Inc.) in a direction vertical to the glass plate at a speed of 300 mm/minute to measure the strength required for the peeling. The peeling strength was measured for the initial wavelength conversion sheets and also for the wavelength conversion sheets after allowed to stand in an environment of 60° C. and 95% RH over 1000 hours (i.e. after a moisture resistance test). The results of the measurement are shown in Table 2. It will be noted that the term "peeled" in Table 2 means that the phosphor layer and the primer layer were peeled off from each other before the peeling test was carried out.

TABLE 2

|  | Primer layer | | Resin in phosphor layer | Peeling strength (N/cm) | | Water vapor transmission rate (mg/m²- day) |
|---|---|---|---|---|---|---|
|  | Type of silane coupling agent | Thickness (nm) |  | Initial strength | Strength after moisture resistance test |  |
| Ex. 2-1 | amine-based agent | 30 | epoxy resin | 6.1 | 5.6 | 4 |
| Ex. 2-2 | amine-based agent | 100 | epoxy resin | 5.5 | 4.8 | 4 |
| Ex. 2-3 | amine-based agent | 500 | epoxy resin | 1.7 | 1.5 | 4 |
| Ex. 2-4 | amine-based agent | 5 | epoxy resin | 5.8 | 5.5 | 4 |
| Ex. 2-5 | amine-based agent | 100 | epoxy resin | 6.2 | 6.1 | 4 |
| Ex. 2-6 | amine-based agent | 30 | epoxy resin | 5.6 | 5.0 | 5 |

TABLE 2-continued

| | Primer layer | | Resin in phosphor layer | Peeling strength (N/cm) | | Water vapor transmission rate (mg/m²· day) |
|---|---|---|---|---|---|---|
| | Type of silane coupling agent | Thickness (nm) | | Initial strength | Strength after moisture resistance test | |
| Ex. 2-7 | amine-based agent | 30 | epoxy resin | 6.8 | 6.2 | 4 |
| Ex. 2-8 | amine-based agent | 30 | epoxy resin | 6.8 | 6.2 | 6 |
| Comp. Ex. 2-1 | — | — | epoxy resin | 0.2 | peeled | 4 |
| Comp. Ex. 2-2 | methacrylate-based agent | 30 | epoxy resin | 0.3 | peeled | 4 |
| Comp. Ex. 2-3 | amine-based agent | 30 | acrylic resin | 0.3 | peeled | 4 |

As will be apparent from the results shown in Table 2, it has been confirmed that the wavelength conversion sheets of Examples 2-1 to 2-8 have excellent gas barrier properties and excellent initial adhesion and excellent adhesion after the moisture resistance test.

REFERENCE SIGNS LIST

1 . . . First film; 2 . . . Second film; 3 . . . Third film; 4 . . . Primer layer; 5 . . . Adhesion layer; 6 . . . Mat layer; 7 . . . Phosphor layer; 11 . . . First substrate; 21 . . . Second substrate; 31 . . . Third substrate; 12, 22 . . . Anchor coat layer; 13, 23 . . . Inorganic thin film layer; 14, 24 . . . Gas barrier coating layer; 15, 25 . . . Barrier layer; 50, 55, 60, 70, 80, 85, 100, 200, 300, 400, 500, 600 . . . Barrier film; 800, 1100, 1200, 1300, 1400, 1500, 1600 . . . Wavelength conversion sheet.

What is claimed is:

1. A barrier film, comprising:
a gas barrier film, and,
a primer layer in direct physical contact with the gas barrier film and made of a cured product of a primer composition consisting of: (a) a silane coupling agent; (b) a metal chelating compound and (c) a solvent;
wherein the gas barrier film comprises a transparent polymer substrate and a transparent inorganic thin film layer;
wherein the transparent inorganic thin film layer comprises: (i) an oxide of aluminum, copper, indium or silicon; (ii) a nitride of aluminum, copper, indium or silicon; or (iii) a nitrided oxide of aluminum, copper, indium or silicon;
wherein the transparent inorganic thin film layer has a thickness of not less than 5 nm to not larger than 100 nm;
wherein the silane coupling agent is the only silane coupling agent in the primer composition;
wherein the only silane coupling agent in the primer composition is selected from the group consisting of 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-metharyloxypropylmethyldiethoxysilane, 3-methacryloxypropyltriethoxysilane, N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane hydrochloride; and
wherein the primer layer is an outermost layer of the barrier film.

2. The barrier film of claim 1, wherein the only silane coupling agent in the primer composition is selected from the group consisting of N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane hydrochloride.

3. The barrier film of claim 1, wherein a thickness of the primer layer is from 5 to 80 nm.

4. The barrier film of claim 1, wherein the transparent inorganic thin film layer is a silicon oxide layer.

5. The barrier film of claim 1, wherein the primer layer is in direct physical contact with the transparent polymer substrate of the gas barrier film.

6. The barrier film of claim 1, wherein the gas barrier film further comprises a gas barrier coating layer in direct physical contact with the transparent inorganic thin film layer, the gas barrier coating layer has a thickness from 100 to 1000 nm, the gas barrier coating layer comprises a silane compound.

7. The barrier film of claim 1, wherein the metal chelating compound is selected from the group consisting of an aluminum chelate, a zirconium chelate and a titanium chelate.

8. The barrier film of claim 7, wherein the only silane coupling agent in the primer composition is selected from the group consisting of 2-(3,4-epoxycyclohexyl)ethyltriethoxysilane, 3-glycidoxypropylmethyldimethoxysilane, 3-glycidoxypropyltrimethoxysilane, 3-glycidoxypropylmethyldiethoxysilane, and 3-glycidoxypropyltriethoxysilane.

9. The barrier film of claim 7, wherein the only silane coupling agent in the primer composition is selected from the group consisting of 3-methacryloxypropylmethyldimethoxysilane, 3-methacryloxypropyltrimethoxysilane, 3-metharyloxypropylmethyldiethoxysilane, and 3-methacryloxypropyltriethoxysilane.

10. The barrier film of claim 7, wherein the only silane coupling agent in the primer composition is selected from the group consisting of N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, 3-triethoxysilyl-N-(1,3-dimethylbutylidene)propylamine, N-phenyl-3-aminopropyltrimethoxysilane, and N-(vinylbenzyl)-2-aminoethyl-3-aminopropyltrimethoxysilane hydrochloride.

11. The barrier film of claim 1, wherein the metal chelating compound is selected from the group consisting of zirconium tributoxy monoacetylacetonate, zirconium tetraacetylacetonate, zirconium dibutoxy bis(ethylacetoacetate), titanium diisopropoxy bis(ethylacetoacetate), titanium di-2-ethylhexoxy bis(2-ethyl-3-hydroxyhexoxide), titanium diisopropoxy bis(triethanol aminate), titanium-1,3-propoanedioxy bis(ethylacetoacetate), titanium aminoethylaminoethanolate, titanium diisopropoxy bis(acetylacetonate), titanium tetraacetylacetonate, and aluminum bisethylacetoacetate monoacetylacetonate.

12. The barrier film of claim 11, wherein the only silane coupling agent in the primer composition is 3-glycidoxypropylmethyldimethoxysilane or 3-glycidoxypropyltrimethoxysilane.

13. The barrier film of claim 11, wherein the only silane coupling agent in the primer composition is 3-methacryloxypropylmethyldimethoxysilane or 3-methacryloxypropyltrimethoxysilane.

14. The barrier film of claim 11, wherein the only silane coupling agent in the primer composition is 3-aminopropyltriethoxysilane or 3-aminopropyltrimethoxysilane.

15. The barrier film of claim 1, wherein the metal chelating compound is a zirconium chelate.

16. The barrier film of claim 15, wherein a mass ratio between the only silane coupling agent in the primer composition and the zirconium chelate is from 10:1 to 1:10.

17. The barrier film of claim 16, wherein the zirconium chelate is zirconium tetraacetylacetonate.

18. A wavelength conversion sheet, comprising:
a phosphor layer containing a phosphor, and,
the barrier film of claim 1 stacked on at least one surface of the phosphor layer, wherein the barrier film has the primer layer on an outermost surface of the phosphor layer side thereof.

19. An optical laminate, comprising:
an adherend containing an epoxy resin, and,
the barrier film of claim 1 stacked on at least one surface of the adherend.

* * * * *